(12) United States Patent
Barth et al.

(10) Patent No.: US 8,617,929 B2
(45) Date of Patent: Dec. 31, 2013

(54) ON-CHIP RF SHIELDS WITH FRONT SIDE REDISTRIBUTION LINES

(75) Inventors: Hans-Joachim Barth, Munich (DE); Thorsten Meyer, Regensburg (DE); Markus Brunnbauer, Lappersdorf (DE); Jenei Snezana, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/456,331

(22) Filed: Apr. 26, 2012

(65) Prior Publication Data

US 2012/0208320 A1 Aug. 16, 2012

Related U.S. Application Data

(62) Division of application No. 12/242,688, filed on Sep. 30, 2008, now Pat. No. 8,178,953.

(51) Int. Cl.
*H01L 21/00* (2006.01)

(52) U.S. Cl.
USPC ............................................................ 438/113

(58) Field of Classification Search
USPC ......... 438/113, 112, 106–108, 637, 639, 629, 438/667, 640; 257/E23.114
See application file for complete search history.

(56) References Cited

U.S. PATENT DOCUMENTS

| | | |
|---|---|---|
| 5,151,770 A | 9/1992 | Inoue |
| 5,196,920 A | 3/1993 | Kumamoto et al. |
| 5,202,754 A | 4/1993 | Bertin et al. |
| 5,272,098 A | 12/1993 | Smayling et al. |
| 5,475,255 A | 12/1995 | Joardar et al. |
| 5,500,789 A | 3/1996 | Miller et al. |
| 5,955,789 A | 9/1999 | Vendramin |
| 6,022,791 A | 2/2000 | Cook et al. |
| 6,307,252 B1 | 10/2001 | Knoedl, Jr. |
| 6,486,534 B1 | 11/2002 | Sridharan et al. |
| 6,548,391 B1 | 4/2003 | Ramm et al. |
| 6,618,267 B1 | 9/2003 | Dalal et al. |
| 6,686,649 B1 | 2/2004 | Mathews et al. |
| 6,888,063 B1 | 5/2005 | Lien et al. |
| 6,947,295 B2 | 9/2005 | Hsieh |
| 6,982,477 B2 | 1/2006 | Adan |
| 6,998,712 B2 | 2/2006 | Okada et al. |
| 7,033,927 B2 | 4/2006 | Cohen et al. |
| 7,049,682 B1 | 5/2006 | Mathews et al. |
| 7,079,086 B2 | 7/2006 | Aisenbrey |
| 7,170,144 B2 | 1/2007 | Hsu |
| 7,336,221 B2 | 2/2008 | Matsuo et al. |
| 7,371,977 B1 | 5/2008 | Preonas |
| 7,427,803 B2 | 9/2008 | Chao et al. |
| 7,439,621 B1 | 10/2008 | Ishida et al. |

(Continued)

FOREIGN PATENT DOCUMENTS

DE 10 2004 022 884 A1 12/2005

*Primary Examiner* — Hoa B Trinh
(74) *Attorney, Agent, or Firm* — Slater & Matsil, L.L.P.

(57) ABSTRACT

A system on chip comprising a RF shield is disclosed. In one embodiment, the system on chip includes a RF component disposed on a chip, first redistribution lines disposed above the system on chip, the first redistribution lines coupled to I/O connection nodes. The system on chip further includes second redistribution lines disposed above the RF component, the second redistribution lines coupled to ground potential nodes. The second redistribution lines include a first set of parallel metal lines coupled together by a second set of parallel metal lines.

20 Claims, 27 Drawing Sheets

(56) References Cited

U.S. PATENT DOCUMENTS

| | | |
|---|---|---|
| 7,545,047 B2 | 6/2009 | Bauer et al. |
| 7,545,662 B2 | 6/2009 | Wang et al. |
| 7,550,850 B2 | 6/2009 | Nakashiba |
| 7,619,297 B2 | 11/2009 | Wang |
| 7,629,674 B1 | 12/2009 | Foster |
| 7,745,910 B1 | 6/2010 | Olson et al. |
| 7,821,110 B2 | 10/2010 | Kim et al. |
| 7,936,052 B2 | 5/2011 | Barth et al. |
| 7,948,064 B2 | 5/2011 | Barth et al. |
| 8,063,469 B2 | 11/2011 | Barth et al. |
| 8,169,059 B2 | 5/2012 | Barth et al. |
| 2001/0052645 A1 | 12/2001 | Op'T Eynde et al. |
| 2002/0167071 A1 | 11/2002 | Wang |
| 2003/0003724 A1 | 1/2003 | Uchiyama et al. |
| 2004/0178500 A1 | 9/2004 | Usui |
| 2004/0195591 A1 | 10/2004 | Gehman et al. |
| 2005/0135727 A1 | 6/2005 | Piede et al. |
| 2005/0218465 A1 | 10/2005 | Cummins |
| 2005/0233581 A1 | 10/2005 | Soejima et al. |
| 2005/0282381 A1 | 12/2005 | Cohen et al. |
| 2006/0027934 A1 | 2/2006 | Edelstein et al. |
| 2006/0186513 A1 | 8/2006 | Kitaguchi |
| 2006/0192265 A1 | 8/2006 | Hsu |
| 2006/0197214 A1 | 9/2006 | Chen |
| 2006/0220178 A1 | 10/2006 | Kubo et al. |
| 2006/0229683 A1 | 10/2006 | Wang et al. |
| 2007/0023203 A1 | 2/2007 | Leizerovich et al. |
| 2007/0262422 A1 | 11/2007 | Bakalski et al. |
| 2007/0281438 A1 | 12/2007 | Liu et al. |
| 2008/0064189 A1 | 3/2008 | Daubenspeck et al. |
| 2008/0073747 A1 | 3/2008 | Chao et al. |
| 2008/0073752 A1 | 3/2008 | Asai et al. |
| 2008/0079168 A1 | 4/2008 | Barth |
| 2008/0116541 A1 | 5/2008 | Erturk et al. |
| 2008/0128888 A1 | 6/2008 | Park et al. |
| 2008/0157341 A1* | 7/2008 | Yang et al. .............. 257/700 |
| 2009/0152676 A1 | 6/2009 | Wang |
| 2009/0302438 A1 | 12/2009 | Chauhan et al. |
| 2010/0078771 A1 | 4/2010 | Barth et al. |
| 2010/0078776 A1 | 4/2010 | Barth et al. |
| 2010/0078777 A1 | 4/2010 | Barth et al. |
| 2010/0078779 A1 | 4/2010 | Barth et al. |
| 2010/0127376 A1 | 5/2010 | Karim et al. |
| 2011/0201175 A1 | 8/2011 | Barth et al. |
| 2012/0258594 A1 | 10/2012 | Barth et al. |

* cited by examiner

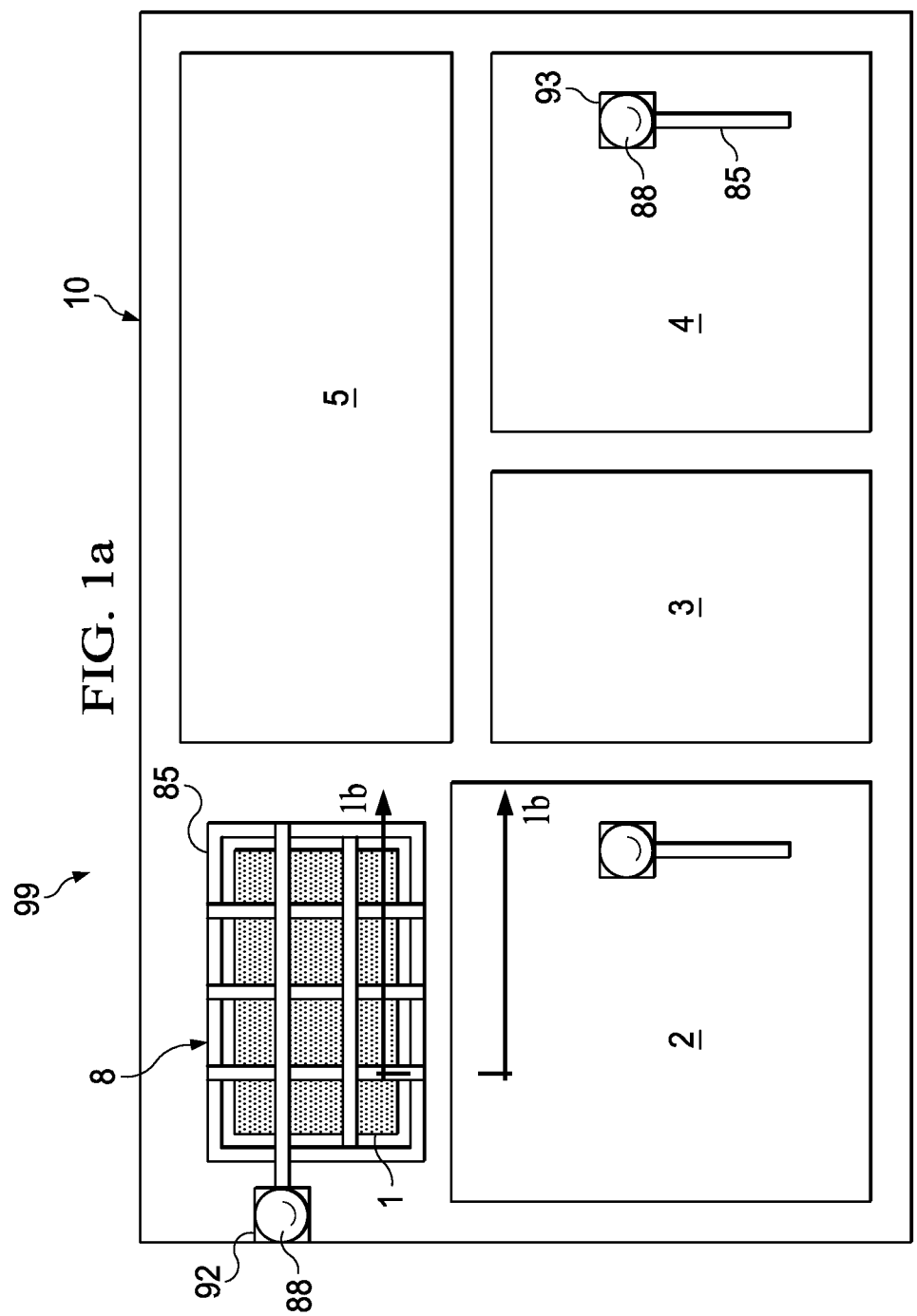

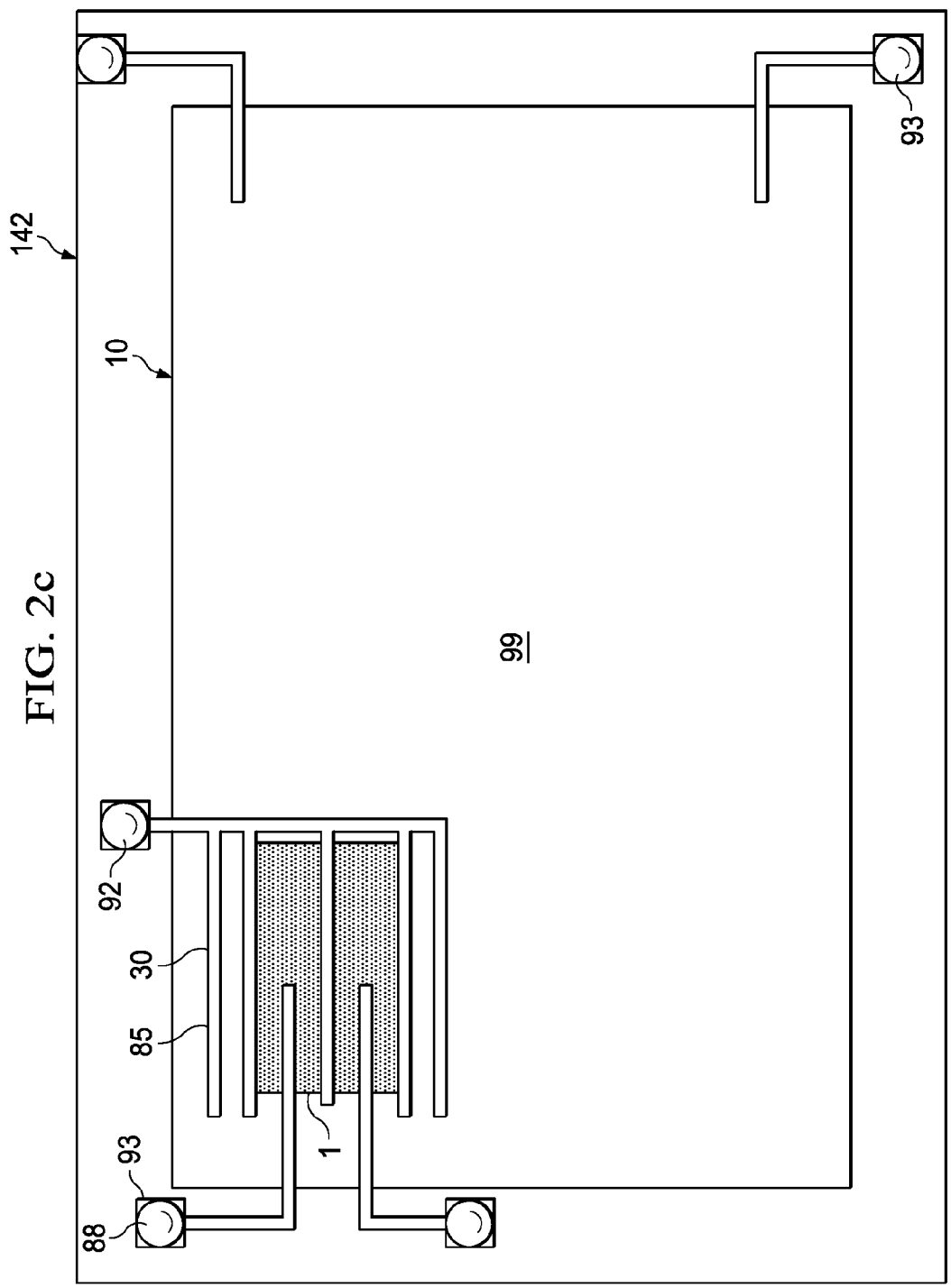

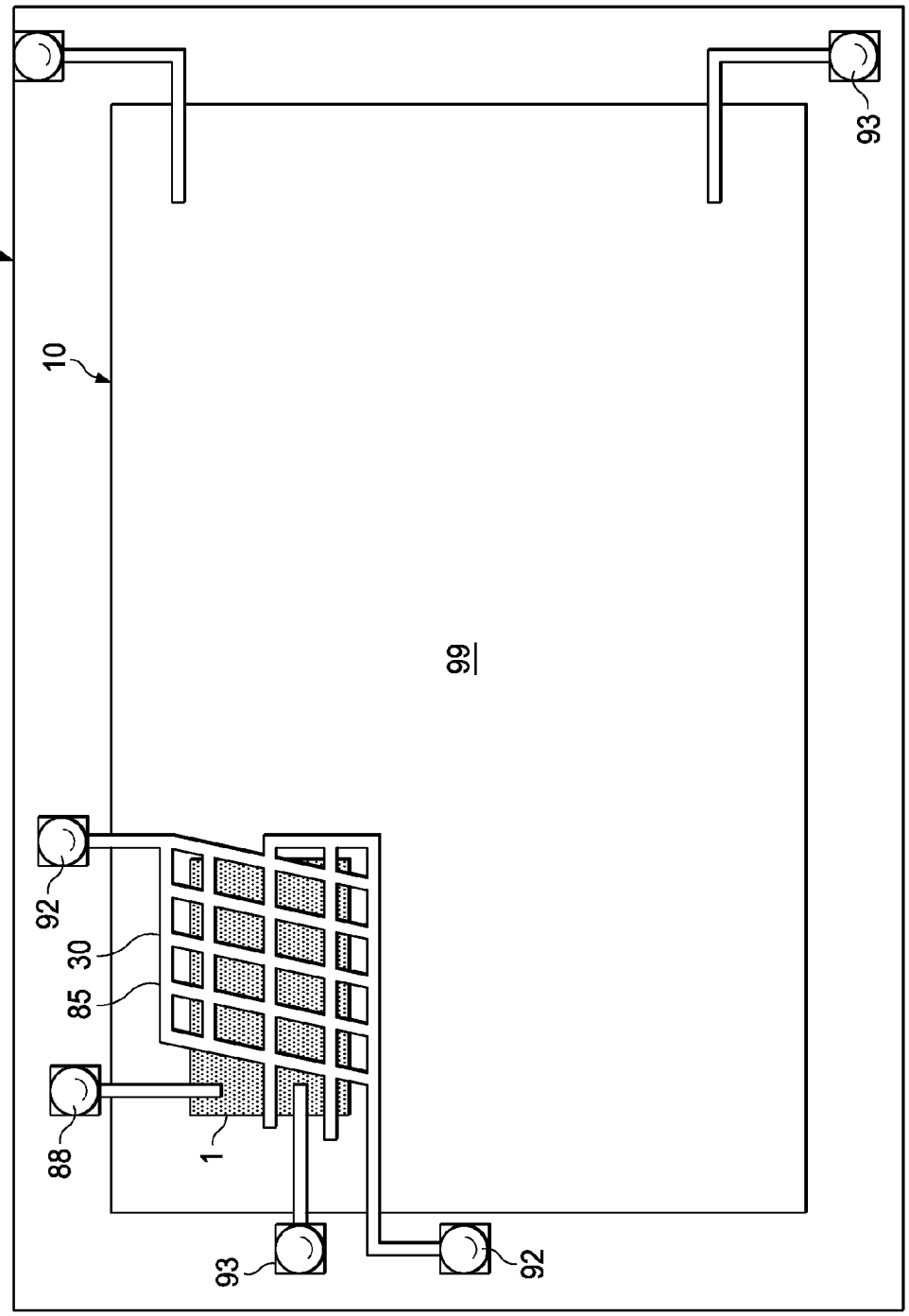

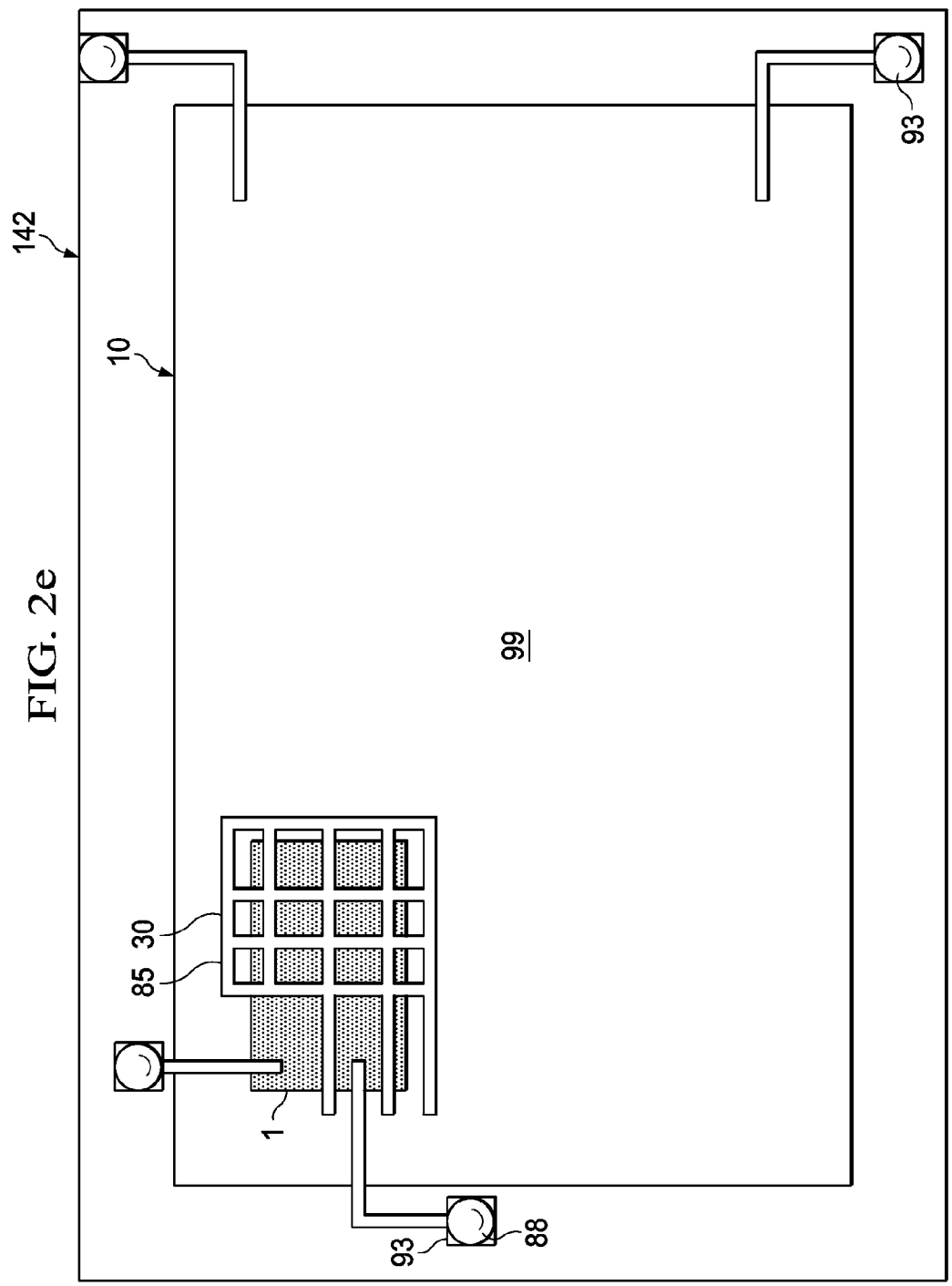

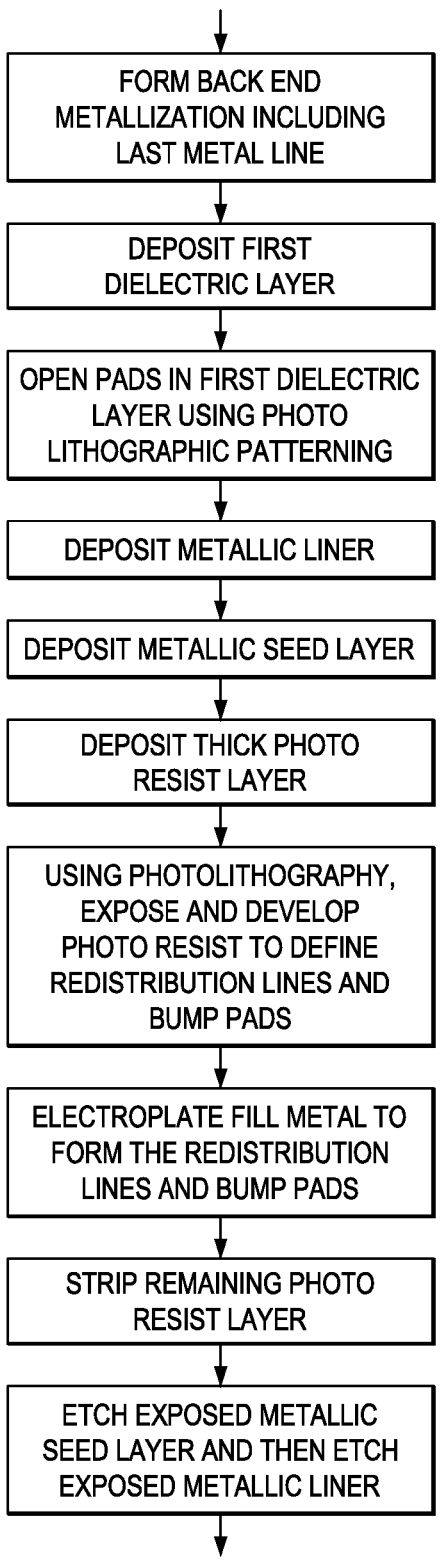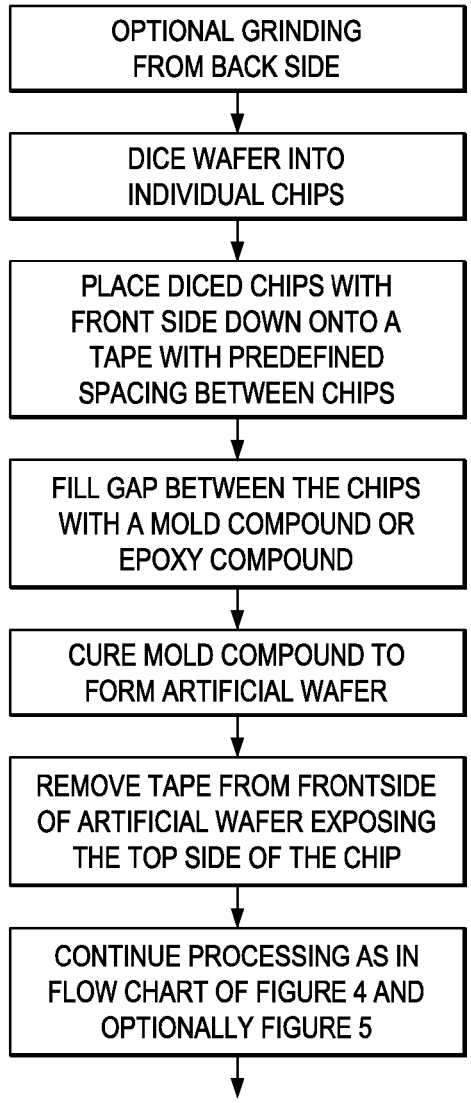

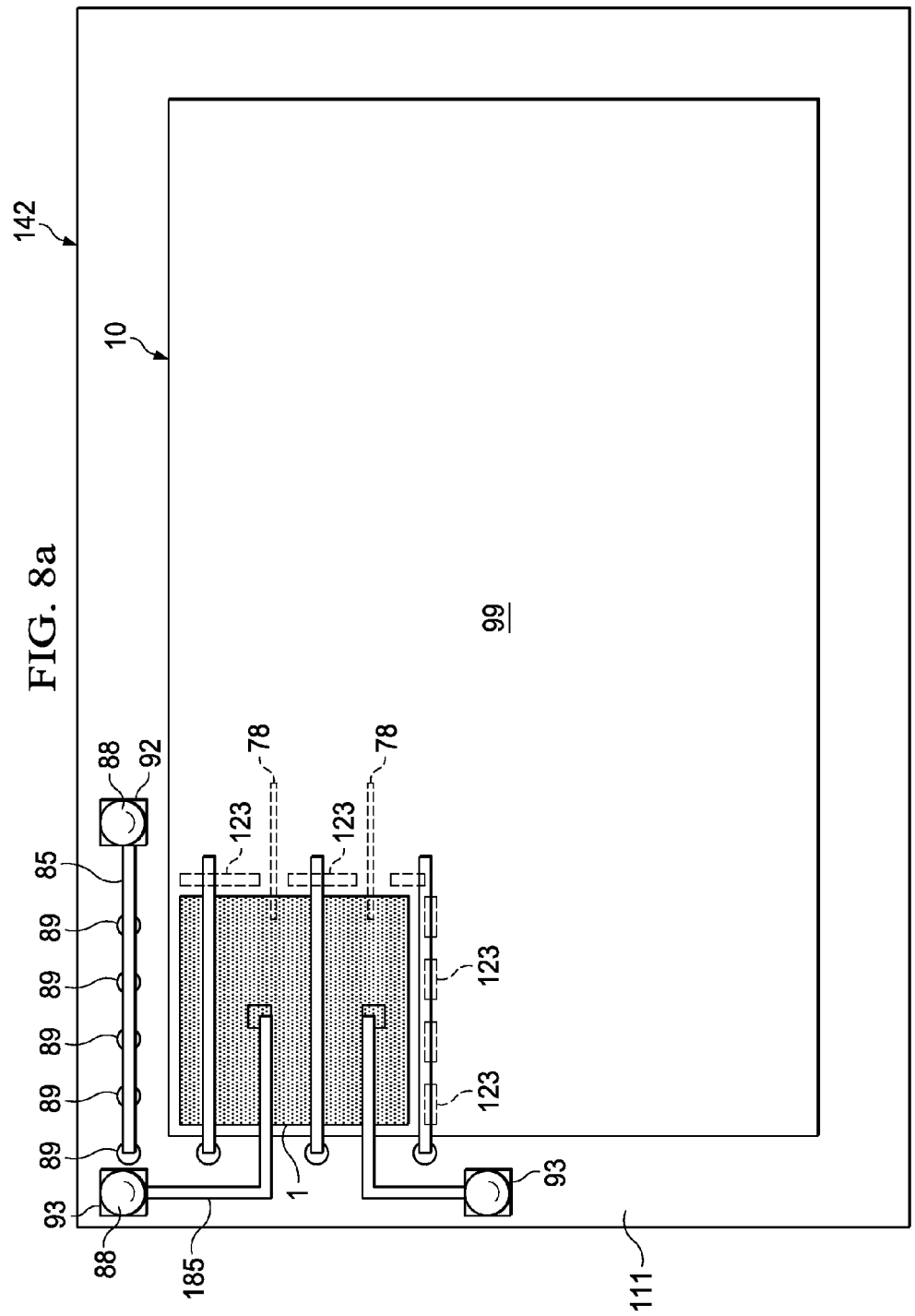

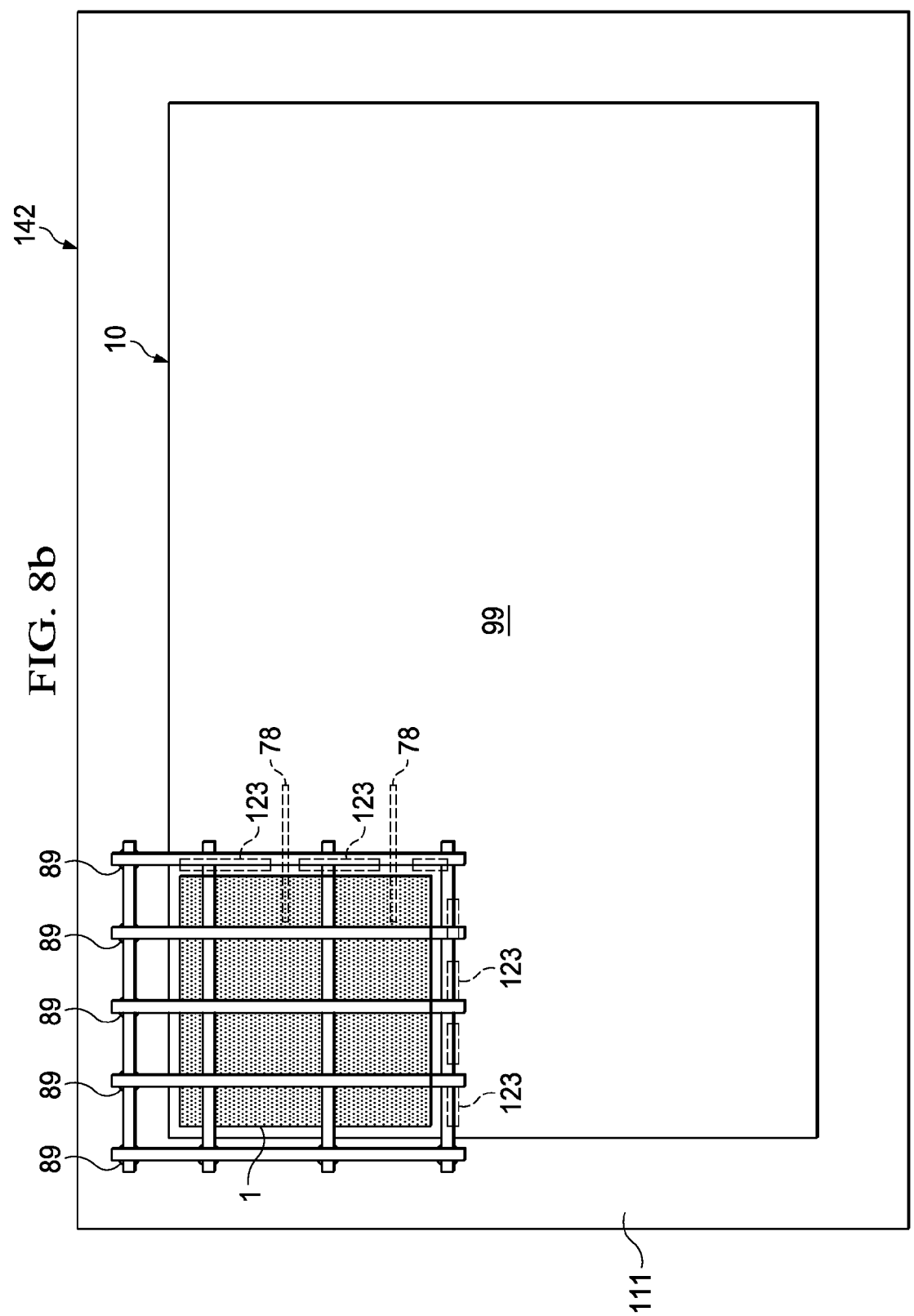

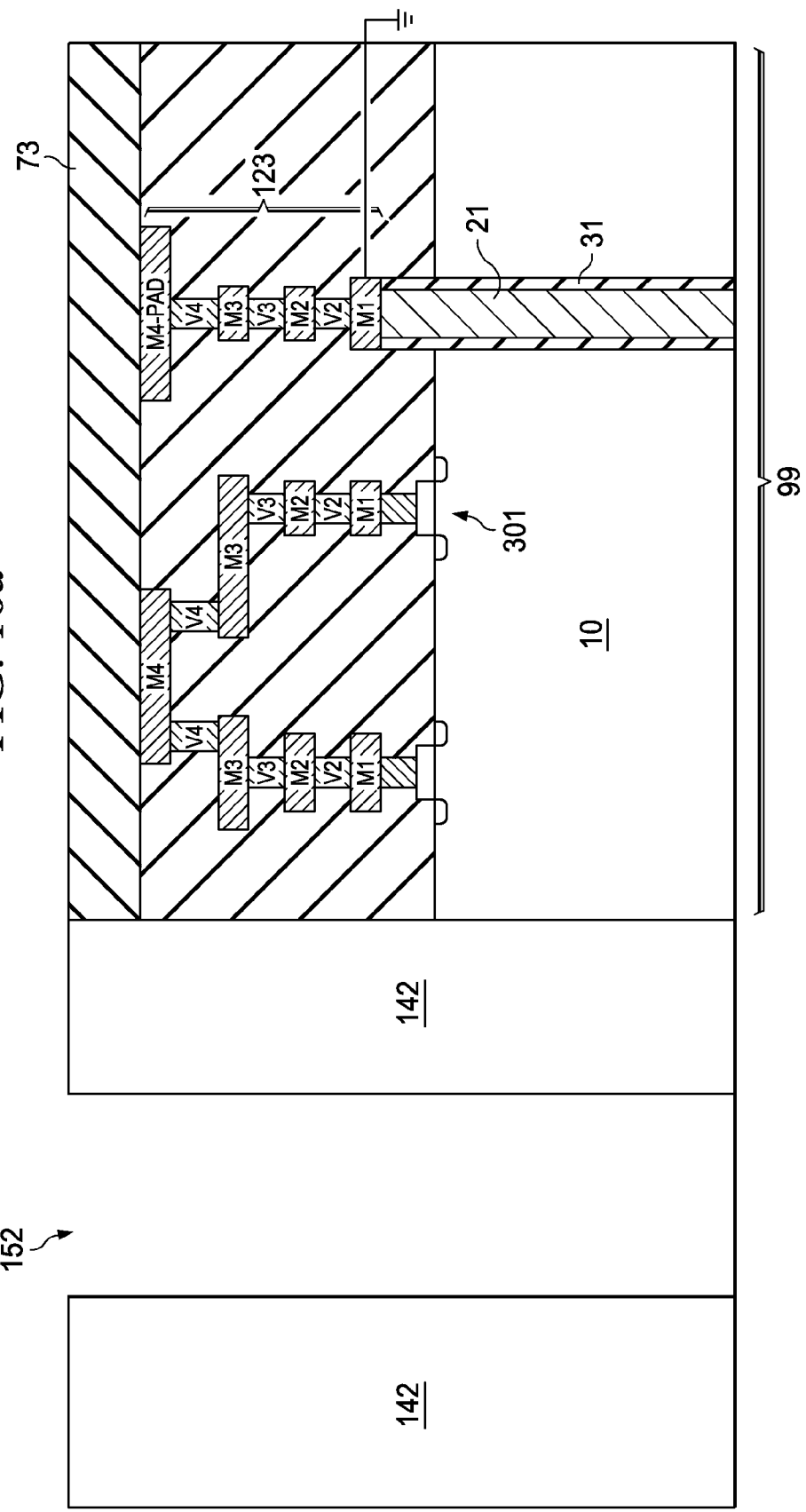

ON-CHIP RF SHIELDS WITH FRONT SIDE REDISTRIBUTION LINES

This application is a divisional of patent application Ser. No. 12/242,688, entitled "On-Chip RF Shields with Front Side Redistribution Lines," filed on Sep. 30, 2008, which application is incorporated herein by reference.

CROSS-REFERENCE TO RELATED APPLICATIONS

This patent application relates to the following commonly assigned co-pending applications concurrently filed, each of which is hereby incorporated herein by reference in its entirety: U.S. Pat. No. 7,948,064, filed on Sep. 30, 2008; U.S. Pat. No. 7,936,052, filed on Sep. 30, 2008; U.S. application Ser. No. 12/242,521, filed on Sep. 30, 2008; and U.S. application Ser. No. 12/242,556, filed on Sep. 30, 2008.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

There is a demand in semiconductor device technology to integrate many different functions on a single chip, e.g., manufacturing analog and digital circuitry on the same die. In such applications, many different components such as digital and analog or RF circuitry are integrated into a single chip. However such integration creates additional challenges that need to be overcome. For example, integration of multiple components results in interference between various components. RF circuits operating at high frequencies produce extraneous electromagnetic radiation that interferes with the operation of other components in the integrated system on chip. This problem deteriorates with subsequent technology generations as operating frequencies continuously increase. Aggressive integration of multiple components in a single chip requires the need to eliminate such interference without a significant increase in production costs.

SUMMARY OF THE INVENTION

These and other problems are generally solved or circumvented, and technical advantages are generally achieved, by preferred embodiments of the present invention which include use of redistribution lines to form an electromagnetic shield.

Embodiments of the invention include RF shields comprising redistribution lines. In accordance with an embodiment of the present invention, a system on chip comprises a radio frequency (RF) component disposed on an edge of a chip, first redistribution lines disposed above the system on chip, the first redistribution lines coupled to I/O connection nodes, and second redistribution lines disposed above the RF component, the second redistribution lines coupled to ground potential nodes, the second redistribution lines comprising a first set of parallel metal lines coupled together by a second set of parallel metal lines.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1a and 1b, illustrates a system on chip with top RF shield comprising a wafer level ball grid array package, wherein FIG. 1a illustrates a top view and FIG. 1b illustrates a cross sectional view, in accordance with an embodiment of the invention;

FIG. 2, which includes FIGS. 2a-2e, is an embodiment of the invention illustrating top views of a system on a chip comprising a fan-out wafer level package, in accordance with an embodiment of the invention;

FIG. 4 illustrates a flow chart describing steps in a fabrication of the system on chip illustrated in FIG. 3, in accordance with an embodiment of the invention;

FIG. 7 illustrates a flow chart describing steps in a fabrication of the system on chip illustrated in FIGS. 5 and 6, in accordance with an embodiment of the invention;

FIG. 8, which includes FIGS. 8a and 8b, illustrates top views of through vias disposed in a fan-out region forming a RF shield, in accordance with an embodiment of the invention;

Corresponding numerals and symbols in the different figures generally refer to corresponding parts unless otherwise

DETAILED DESCRIPTION OF ILLUSTRATIVE EMBODIMENTS

Figure 1B:
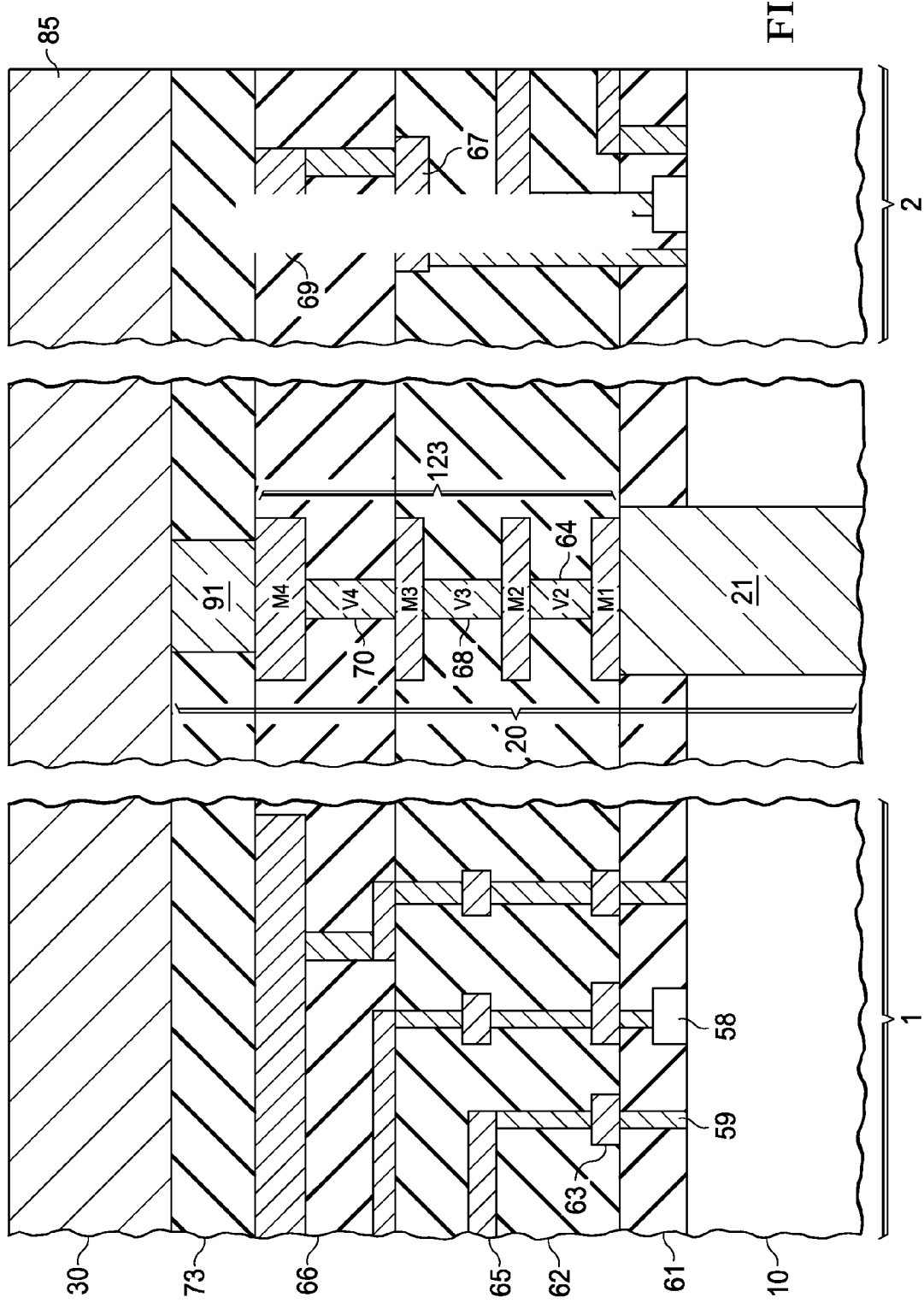

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a method for forming a structure comprising front side redistribution lines forming a RF shield. In various embodiments, the invention avoids the use of separate shielding layers or structures outside the chip (for example, additional packaging layers). The present invention avoids expensive fabrication costs by integrating the RF shield along with wafer level packaging (WLP) rather than being separately attached to the chip. Although illustrated with respect to shielding adjacent components on a system on chip (SoC), the invention may be applied to shielding single chips from adjacent chips.

Wafer level package (WLP) is a promising solution for high-speed packaging needs. Because the length of the interconnection lines on the WLP is limited to die size, the WLP has a minimum number of electrical parasitic elements. In Wafer-Level Packaging (WLP), a integrated circuit is packaged at wafer level, instead of the traditional process of assembling the package of each individual unit after wafer dicing. WLP is a true chip-scale packaging technology, as the resulting package is about the same size as the die. By extending the wafer fab processes to include device interconnection and device protection processes, wafer-level packaging integrates wafer fab processes with packaging and possibly test and burn-in at wafer level, streamlining and reducing manufacturing costs.

In WLP, redistribution lines on the WLP connect the on-chip pads to bump pads used for placing solder balls. In various embodiments, these redistribution lines are formed using standard photolithography and thin film deposition techniques employed in the device fabrication itself. This additional level of interconnection redistributes the peripheral bonding pads of each chip to an area array of underbump metal (UBM) pads that are evenly deployed over the chip's surface. The solder balls or bumps used in connecting the device to the application circuit board are subsequently placed over these UBM pads. Aside from providing the WLP's means of external connection, this redistribution technique also improves chip reliability by allowing the use of larger and more robust balls for interconnection and better thermal management of the device's I/O system.

In a SoC, analog, RF, digital, and memory blocks are integrated in a single chip. Hence, such diverse components must coexist without any parasitic interactions (such as generating minimal noise and being highly immune to the received noise). As the operating frequency of each component increases above the gigahertz frequency range, the electrical performance of a package becomes more critical. Hence to minimize parasitic components, interconnects are optimized which includes reducing interconnect length and using lower resistance lines, and minimizing capacitive coupling between the lines.

However, as operating frequencies increase with scaling, RF components operating at high GHz frequencies emit electromagnetic radiation that interferes with other neighboring components. In various embodiments of the present invention, a conductive shield formed in the wafer level package surrounds the RF components to minimize this interference. The conductive shield blocks out the electromagnetic radiation generated by the RF circuitry from reaching other components of the SoC. In various embodiments, the conductive shield is formed using redistribution lines of the wafer level package. However, to minimize interference, in one embodiment, redistribution lines are formed as a large structure to maximize shielding of electromagnetic radiation emitted by the operating RF device underneath.

These conflicting requirements are met, by forming tailored redistribution lines corresponding to each set of function. In various embodiments, a first set of redistribution lines are formed to minimize parasitic elements. These first set of redistribution lines are connected to active circuitry. In various embodiments, a second set of redistribution lines is formed that forms a top portion of a RF shield. Unlike the first set of redistribution lines, the second set of redistribution lines is formed as a large structure that would be poor as an interconnect, but serves well as a barrier for the penetration of electromagnetic radiation. As the first and the second set of redistribution lines are formed together in common process steps, the processing requires no additional costs.

These conflicting requirements are met, by forming tailored redistribution lines corresponding to each set of function. In various embodiments, a first set of redistribution lines are formed to minimize parasitic elements. These first set of redistribution lines are connected to active circuitry. In various embodiments, a second set of redistribution lines is formed that forms a top portion of a RF shield. Unlike the first set of redistribution lines, the second set of redistribution lines is formed as a large structure that would be poor as an interconnect, but serves well as a barrier for the penetration of electromagnetic radiation. As the first and the second set of redistribution lines are formed together in common process steps, the processing requires no additional costs. In an embodiment, the second redistribution lines substantially block electromagnetic radiation impinging on the redistribution layer and the first redistribution lines do not substantially block electromagnetic radiation impinging on the redistribution layer.

A structural embodiment of the invention illustrating a top down and cross sectional view of a conductive cage will be first described using FIG. 1. Further structural embodiments of the invention will be described using FIGS. 2, 8 and 9. Embodiments of methods of fabrication of RF shield comprising the fan-out region will be illustrated in FIGS. 3, 5, 6, 10 and 12 along with flow charts of FIGS. 4, 7, 11, and 13.

An embodiment of the invention is illustrated in FIG. 1. The SoC chip 99 illustrated in FIG. 1 comprises a RF circuit 1 along with other semiconductor components 2-5. In one embodiment, the other semiconductor components 2-5 comprise digital logic component, analog component, non-volatile memory, and SRAM component. In various embodiments, less or more components may be present. As described in co-pending application filed Sep. 30, 2008; Ser. No. 12/242,698; electromagnetic radiation emitted by the RF component 1 is shielded by the RF shield 8.

An embodiment of the invention is illustrated in FIG. 1. The SoC chip 99 illustrated in FIG. 1 comprises a RF circuit 1 along with other semiconductor components 2-5. In one embodiment, the other semiconductor components 2-5 comprise digital logic component, analog component, non-volatile memory, and SRAM component. In various embodiments, less or more components may be present. As described in U.S. Pat. No. 7,948,064 filed Sep. 30, 2008, electromagnetic radiation emitted by the RF component 1 is shielded by the RF shield 8.

Referring to FIG. 1b, the cross section illustrates the RF shield 8 comprising a vertical fence 20, the vertical fence 20 comprises an interconnect RF barrier 123 which is coupled to a through substrate via 21 disposed underneath. A through substrate via 21 is disposed in a substrate 10 under the interconnect RF barrier 123. The through substrate via 21 is described in U.S. Pat. No. 7,936,052 filed Sep. 30, 2008 and co-pending application Ser. No. 12/242,521 filed Sep. 30, 2008. The interconnect RF barrier 123 is disposed in first, second, and a third metallization insulation layers 61, 62, and 66 and described in co-pending application filed Sep. 30, 2008, Ser. No. 12/242,566. The interconnect RF barrier 123 is disposed between the RF component 1 and a semiconductor circuitry, for example, digital logic component 2.

Referring to FIG. 1b, the cross section illustrates the RF shield 8 comprising a vertical fence 20, the vertical fence 20 comprises an interconnect RF barrier 123 which is coupled to a through substrate via 21 disposed underneath. A through substrate via 21 is disposed in a substrate 10 under the interconnect RF barrier 123. The through substrate via 21 is described in U.S. Pat. No. 7,936,052 filed Sep. 30, 2008; and in co-pending application Ser. No. 12/242,521, filed Sep. 30, 2008. The interconnect RF barrier 123 is disposed in first, second, and a third metallization insulation layers 61, 62, and 66 and described in co-pending application Ser. No. 12/242, 556, filed Sep. 30, 2008. The interconnect RF barrier 123 is disposed between the RF component 1 and a semiconductor circuitry, for example, digital logic component 2

A passivation layer 73 is disposed above the upper most metal line (fourth metal line 69), and hence above the interconnect RF barrier 123. The passivation layer 73 preferably comprises $SiO_2$ such as tetra ethyl oxysilane (TEOS) oxide or silane oxide, and silicon nitride or silicon oxy nitride (SiON) or combinations thereof. In various embodiments the passivation layer may comprise insulating materials typically used in semiconductor manufacturing, such as doped glass (BPSG, PSG, BSG), organo silicate glass (OSG), carbon doped oxides (CDO), fluorinated silicate glass (FSG), spin-on glass (SOG), or silicon nitride (SiN), silicon oxynitride (SiON), silicon carbide (SiC) or silicon carbo nitride (SiCN). The passivation layer 73 may comprise a thickness of about 500 nm or less, for example, although alternatively, the passivation layer 73 may comprise other dimensions. In other embodiments the passivation layer 73 may be covered by a polyimide, photoimide, a BCB or other organic polymer material.

As illustrated in FIG. 1b, a pad via 91 is disposed on the last metal line and the passivation layer 73. The pad via 91 comprises an outer first conductive liner and core comprising a first conductive material. In various embodiments, the pad via 91 comprises a copper core with an outer liner preferably of tantalum nitride and tantalum. In some embodiments the pad via 91 comprises tungsten and outer liners of titanium and titanium nitride or other metal liners or liner combinations.

A redistribution metal line 85 is disposed on the pad via 91. The redistribution metal line 85 comprises multiple layers, although in some embodiments a single layer may be used. The redistribution metal line 85 provides a strong, stable, low resistance electrical connection to last metal line (fourth metal lines 69) through the pad via 91. The redistribution metal line 85 also provides a strong barrier to prevent the diffusion of other bump metals into the IC. The redistribution metal line 85 is also readily wettable by the bump metals, for solder reflow. Hence, the redistribution metal line 85 typically comprises multiple layers of different metals, such as an adhesion layer, a diffusion barrier layer, and a solderable layer. In various embodiments, the redistribution metal line 85 is deposited by electroplating, sputtering, or deposited by any other suitable process. In one embodiment, the redistribution metal line 85 comprises a TiW/Cu layer stack or Ti/Cu/Ni layer stack. In various embodiments, the redistribution metal line 85 comprises Ti, TiN, Ta, TaN, Cu, Ni, Cr, Cr/Cu, Ni/V, Ti/Cu, TiW, Au, Ni/Au, Ni/Pd/Au, W, WN, WCN and combinations thereof.

The redistribution metal lines 85 are coupled to WLP ground bump pads 92 and WLP bump pads 93. The WLP ground bump pads 92 are coupled to the top shield 30 and are coupled to a ground potential. The WLP bump pads 93 are coupled to the active circuitry and comprise I/O connections for the SoC 99.

Solder ball 88 are disposed on the WLP ground bump pads 92 and WLP bump pads 93. In one embodiment, the solder ball 88 comprises a lead (Pb)-tin (Sn) alloy. In another embodiment, the solder ball 88 comprises Sn/Ag. Other examples of the solder ball 88 include SnPbAg, SnPb, PbAg, PbIn, and lead free materials such as SnBi, SnAgCu, SnTn, and SiZn.

Figure 2A:
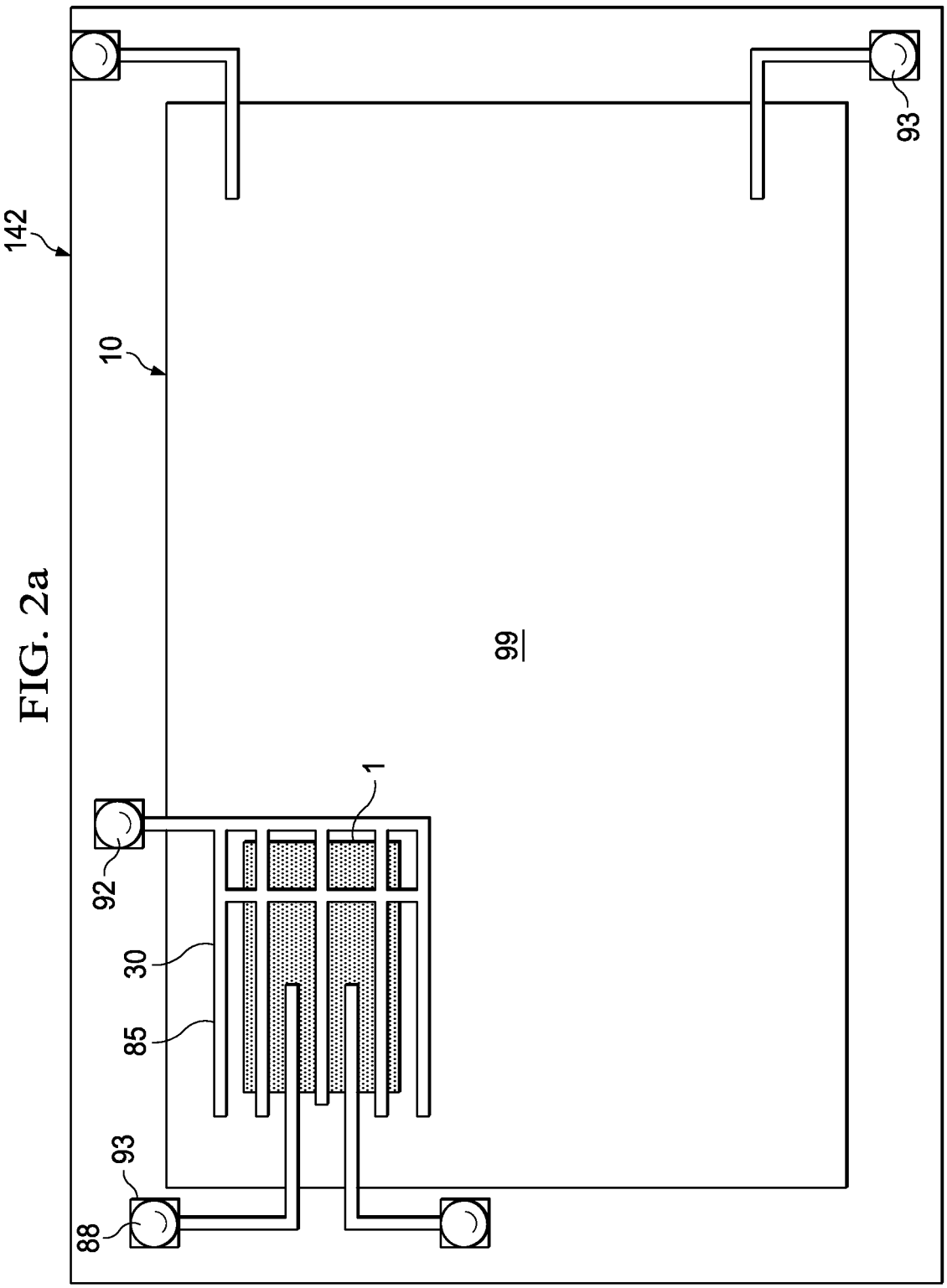
Figure 2B:
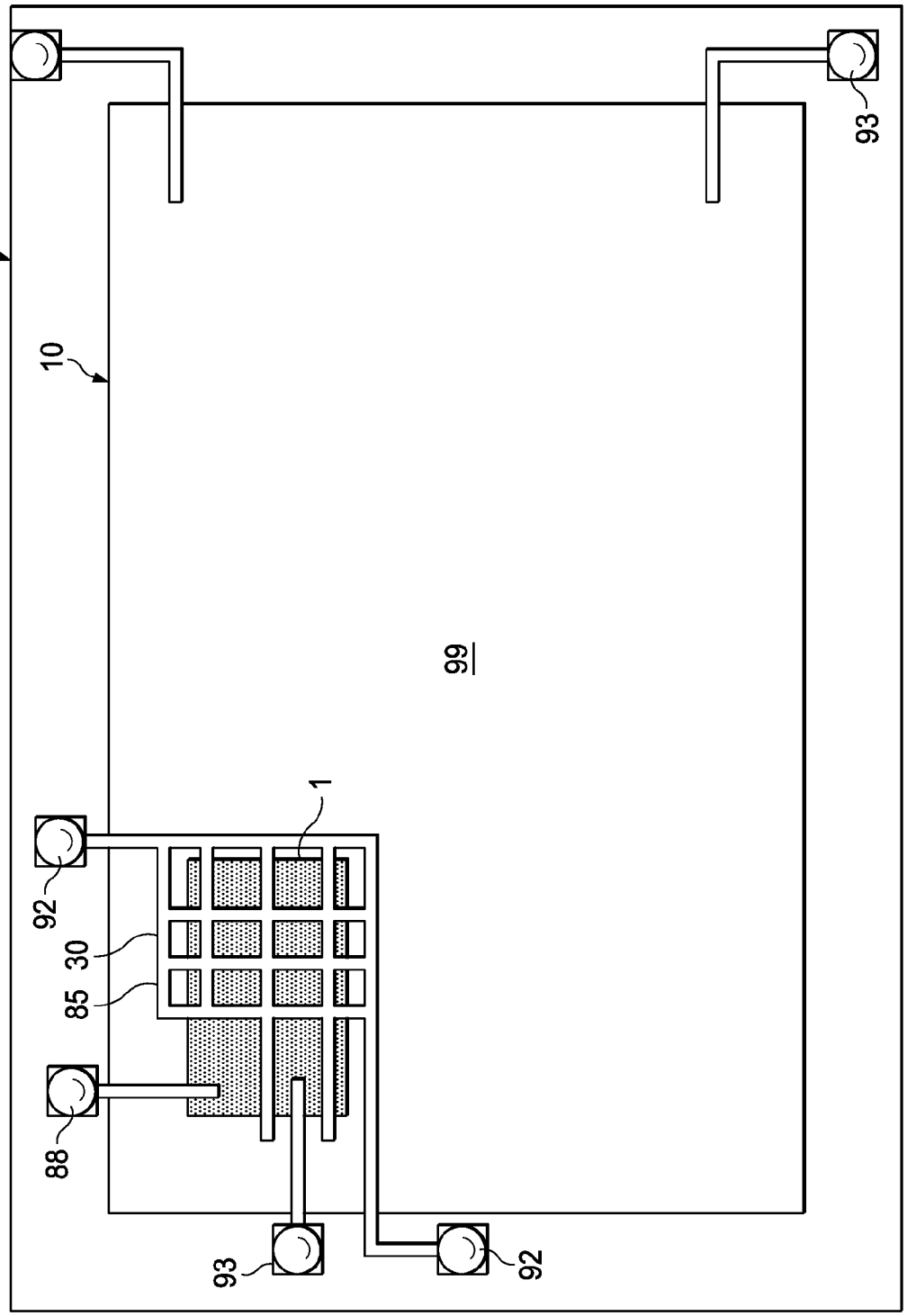

A structural embodiment describing a fan-out WLP is illustrated in FIG. 2, which includes FIGS. 2a-2e.

Referring to FIG. 2a, a system on chip 99 is embedded in a mold compound 142. One part of the system on chip 99 includes a RF component 1. The redistribution lines 85 are disposed above the RF component 1. A portion of the redistribution lines 85 couple to WLP bump pads 93. The remaining portion of the redistribution lines 85 form a top shield 30 and comprise a mesh like structure above the RF component and couple to a ground potential node. Due to the use of a fan-out WLP, the redistribution lines coupled to active circuitry and the redistribution lines forming the top shield 30 can be arranged without space restrictions. This enables maximizing the impact of the shielding ability without compromising on the number of I/O connections coupling to the active circuitry.

FIGS. 2b and 2c illustrate alternate embodiments of FIG. 2a with different designs of the top shield 30. FIG. 2b shows a mesh with parallel and perpendicular redistribution lines 85 covering most regions leaving out some space for the redistribution lines 85 coupled to active circuitry. The mesh is coupled to ground potential nodes. FIG. 2c illustrates a finger structure forming the top shield 30. In various embodiments other designs of the redistribution lines 85 may be used. FIG. 2d illustrates another alternate embodiment wherein the redistribution lines 85 comprise a first set of parallel metal lines and a second set of parallel metal lines. Unlike the prior embodiments, wherein the first set of parallel metal lines and the second set of parallel metal lines are perpendicular, in FIG. 6d, there intersect at a different angle. FIG. 2e illustrates the top shield 30 wherein the top shield 30 is coupled to a ground potential node from the back side of the chip.

FIGS. 2b and 2c illustrate alternate embodiments of FIG. 2a with different designs of the top shield 30. FIG. 2b shows a mesh with parallel and perpendicular redistribution lines 85 covering most regions leaving out some space for the redistribution lines 85 coupled to active circuitry. The mesh is coupled to ground potential nodes. FIG. 2c illustrates a finger structure forming the top shield 30. In various embodiments other designs of the redistribution lines 85 may be used. FIG. 2d illustrates another alternate embodiment wherein the redistribution lines 85 comprise a first set of parallel metal lines and a second set of parallel metal lines. Unlike the prior embodiments, wherein the first set of parallel metal lines and the second set of parallel metal lines are perpendicular, in FIG. 2d, there intersect at a different angle. FIG. 2e illustrates the top shield 30 wherein the top shield 30 is coupled to a ground potential node from the back side of the chip.

Figure 3A:
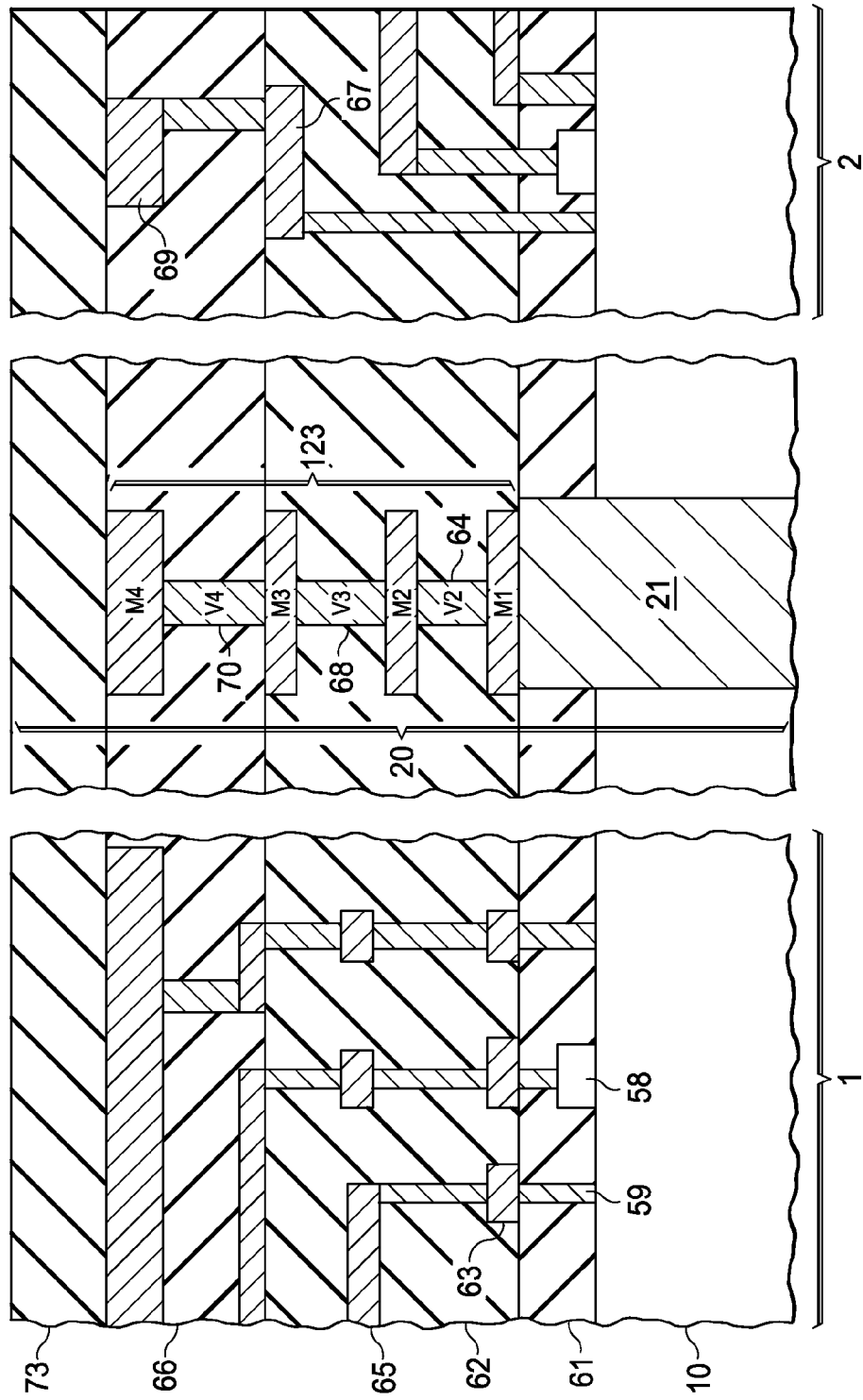
FIG. 3, which includes FIGS. 3a-3e, describes a system on a chip comprising a top RF shield in various stages of fabrication, in accordance with an embodiment of the invention.

FIG. 3a illustrates a cross sectional view after the back end of line processes forming the interconnect layers. The through substrate via 21 is formed in the substrate, and described in detail in co-pending application filed Sep. 30, 2008; Ser. No. 12/242,521. The interconnect RF barrier 123 is formed over the through substrate via and is described in co-pending application filed Sep. 30, 2008; Ser. No. 12/242, 566. In various embodiments, interconnect RF barrier 123 is formed as a stack over the through substrate via 21. At this stage, processing of all interconnect levels (metal lines, vias, bond pads in the last metal level) is complete. In various embodiments, the last metal level comprising the bond pads comprises copper, aluminum, nickel, palladium, gold, silver, an alloy thereof, or a combination thereof.

FIG. 3a illustrates a cross sectional view after the back end of line processes forming the interconnect layers. The through substrate via 21 is formed in the substrate, and described in detail in co-pending application Ser. No. 12,242, 521, filed Oct. 10, 2008. The interconnect RF barrier 123 is formed over the through substrate via and is described in co-pending application Ser. No. 12,242,556, filed Oct. 10, 2008. In various embodiments, interconnect RF barrier 123 is formed as a stack over the through substrate via 21. At this stage, processing of all interconnect levels (metal lines, vias, bond pads in the last metal level) is complete. In various embodiments, the last metal level comprising the bond pads comprises copper, aluminum, nickel, palladium, gold, silver, an alloy thereof, or a combination thereof.

A first dielectric layer 81 is formed over the passivation layer 73. In various embodiments, the first dielectric 81 is coated, for example, by a spin-on process or applied using a chemical vapor deposition process. In various embodiments, the first dielectric layer 81 comprises organic polymer, BCB, polyimide, photoimide or inorganic dielectric.

Figure 3B:
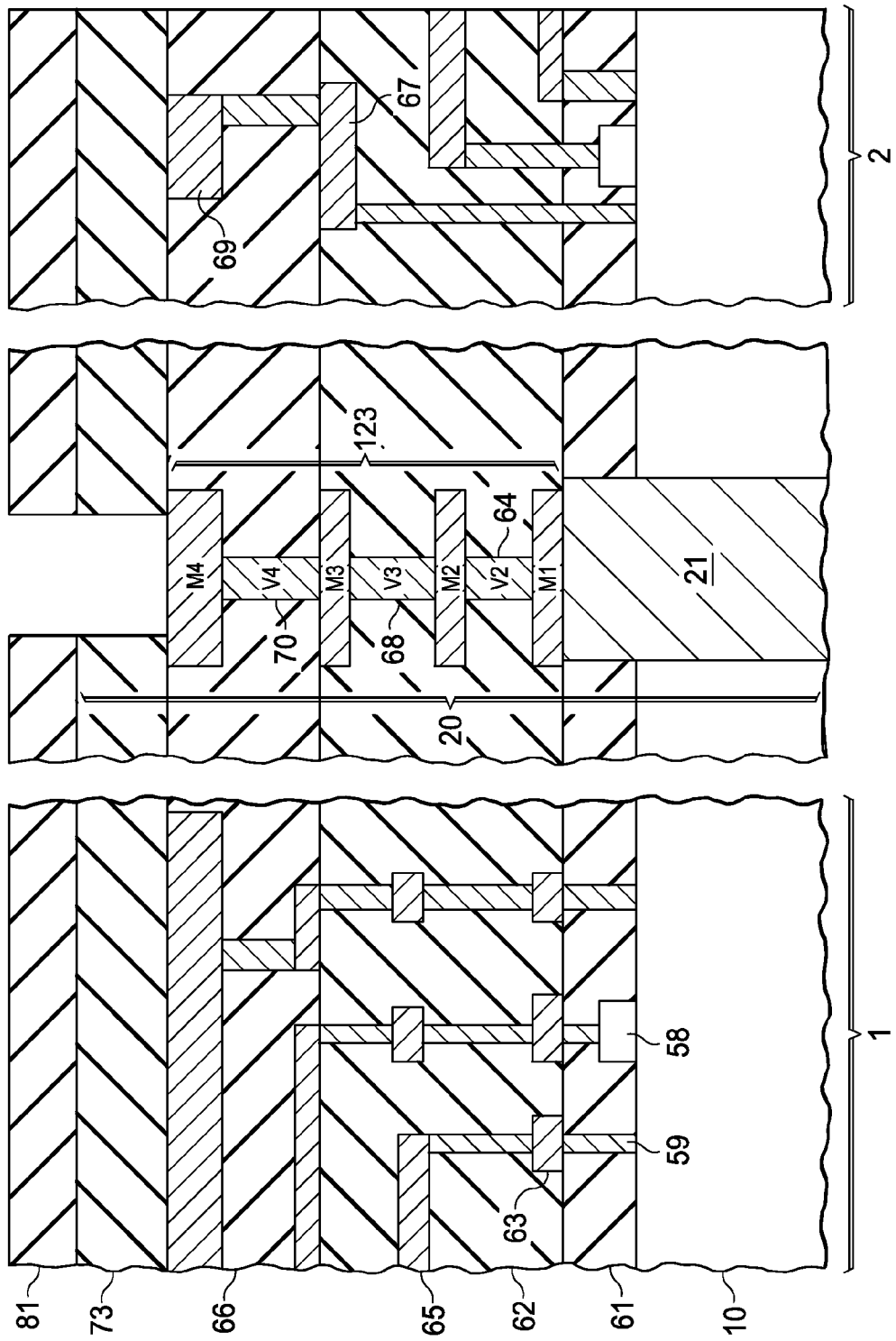

In some embodiments, the first dielectric layer 81 is also photo sensitive and can be directly exposed using photolithography. Examples of photo-sensitive first dielectric layer 81 include photo-sensitive polyimides that can be directly developed. In case of a non-photo-sensitive polyimide, a photo resist is deposited. Using a photolithography process, the first dielectric layer 81 and the passivation layer 73 are patterned to open the bond pads on the last metal level (FIG. 3b).

Figure 3C:
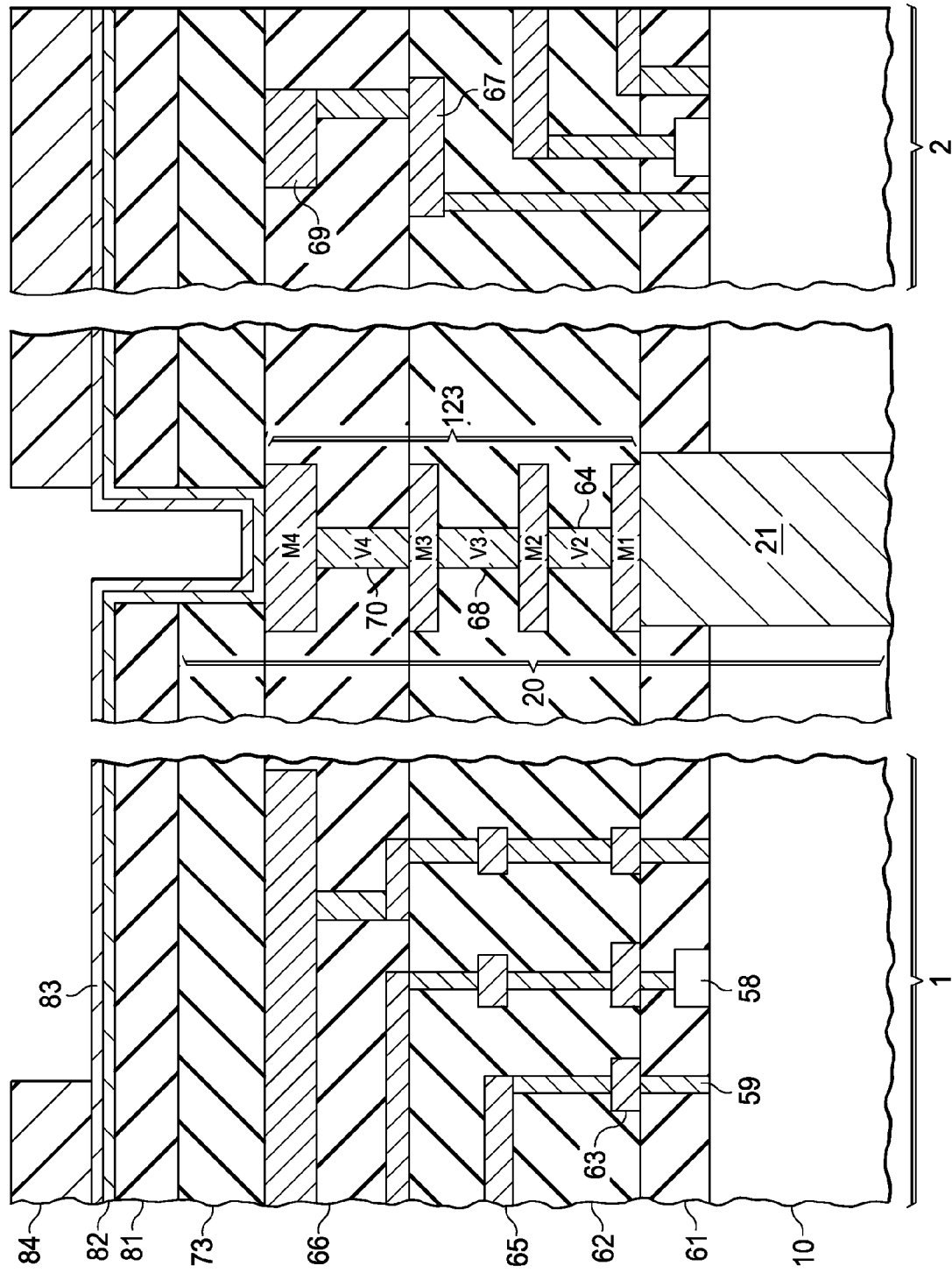

Referring to FIG. 3c, a metallic liner 82 is deposited. The metallic liner 82 covers the fourth metal lines 69. In various embodiments, the metallic liner 82 is deposited using a deposition process to form a conformal layer comprising Ti, Ta, Ru, W, combinations thereof, or a nitride, silicide, carbide thereof. Examples of such combinations include TiN, TaN, and WN, and TiW. In various embodiments, the metallic liner 82 is deposited using a chemical vapor deposition, plasma vapor deposition or atomic layer deposition. In various embodiments, the metallic liner 82 comprises a thickness of about 20 nm to about 200 nm.). The metallic liner 82 is a diffusion barrier metal and prevents out-diffusion of copper from the last metal line as well as any intermixing with further metallic layers.

As illustrated in FIG. 3c, a metallic seed layer 83 is deposited. The metallic seed layer 83 covers the metallic liner 82. In various embodiments, the metallic seed layer 83 is deposited using a deposition process to form a conformal layer. In various embodiments, the metallic seed layer 83 is deposited using a chemical vapor deposition, plasma vapor deposition or atomic layer deposition. In various embodiments, the metallic seed layer 83 comprises a thickness of about 20 nm to about 200 nm. The metallic seed layer 83 provides the seed layer for the growth during the electroplating process. In various embodiments, the metallic seed layer comprises copper or other metals like Al, W, Ag, Au, Ni or Pd.

As illustrated in FIG. 3c, a thick photo resist layer 84 is deposited. In various embodiments, the photo resist layer is several microns thick, and varies from about 1 um to about 10 um, in one embodiment. The thick photo resist layer 84 fills the opening formed in the passivation layer 73. The photo resist layer 84 is exposed and developed. The patterned photo resist layer 84 comprises patterns for redistribution metal lines and pad vias.

Figure 3D:
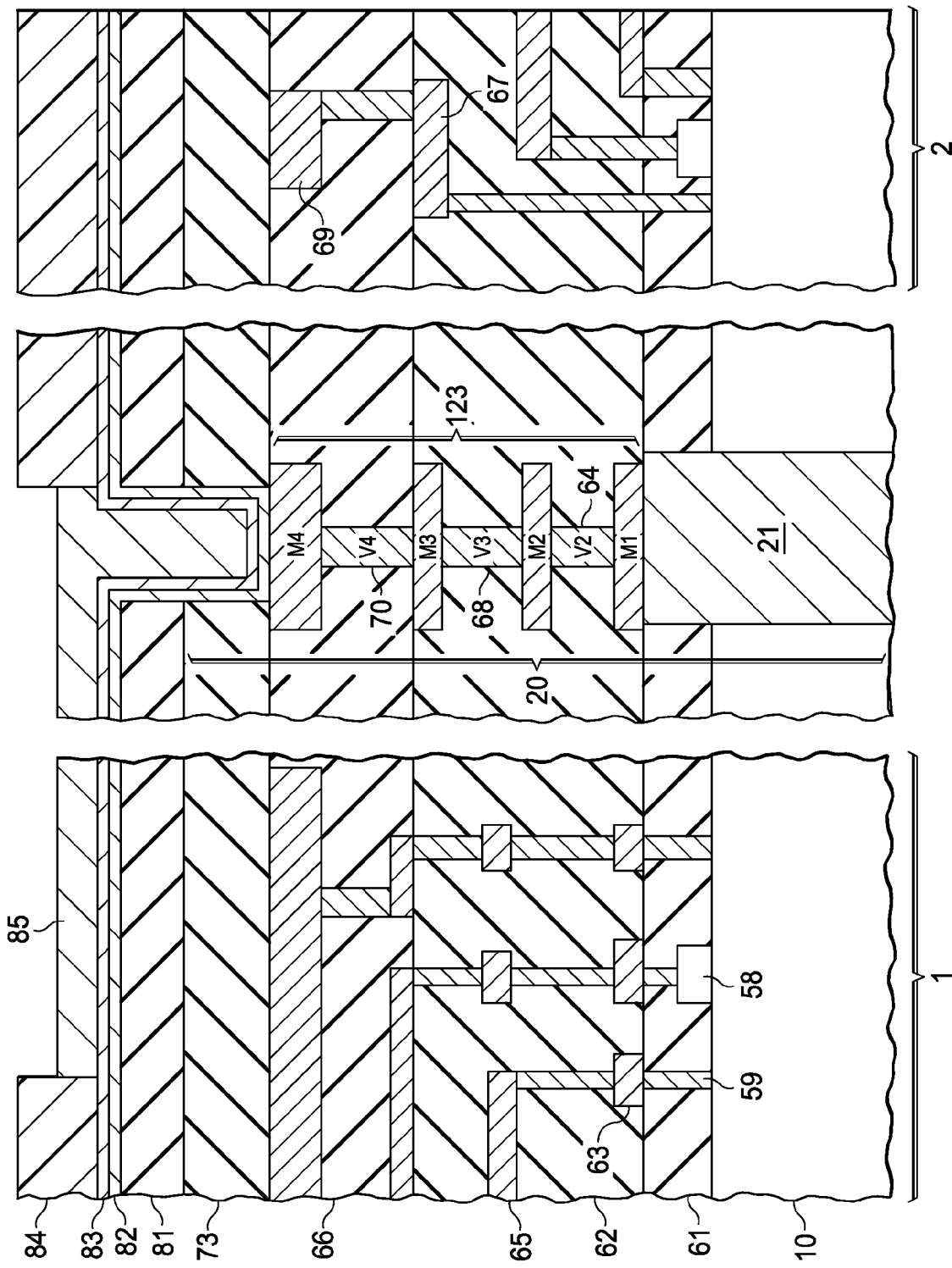

Referring next to FIG. 3d, a redistribution metal line 85 and via pad 91 are formed by electroplating a fill metal over the metallic seed layer 83. In various embodiments, the fill metal comprises copper, although in some embodiments, other suitable conductors are used. The metallic seed layer 83 comprises a same material as the material of the subsequent metal lines to enable electroplating, in one embodiment. In various embodiments, the redistribution metal line 85 comprises multiple layers, for example, Cu/Ni, Cu/Ni/Pd/Au, Cu/NiMoP/Pd/Au, or Cu/Sn, in one embodiment.

Figure 3E:
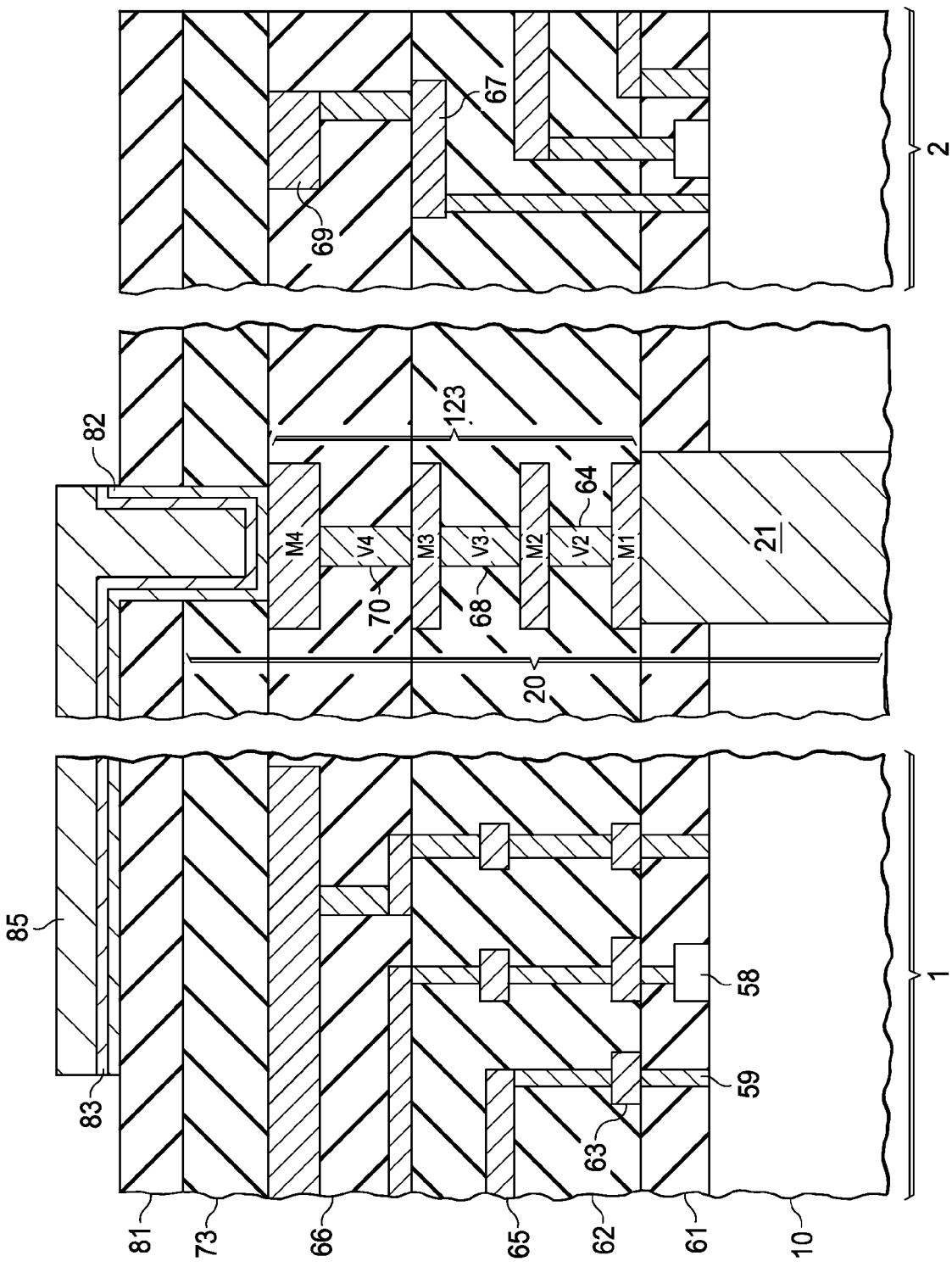

The patterned photo resist layer 84 is stripped to expose the metallic seed layer 83. The metallic seed layer 83 and the metallic liner 82 is next etched away using, for example, a wet etch chemistry. The structure at this stage is illustrated in FIG. 3e and includes bump pads and front side redistribution metal lines 85.

As illustrated in FIG. 5, in some embodiments, solder bumps are formed. In such embodiments, the processing continues from FIGS. 3 and 4.

Figure 5A:
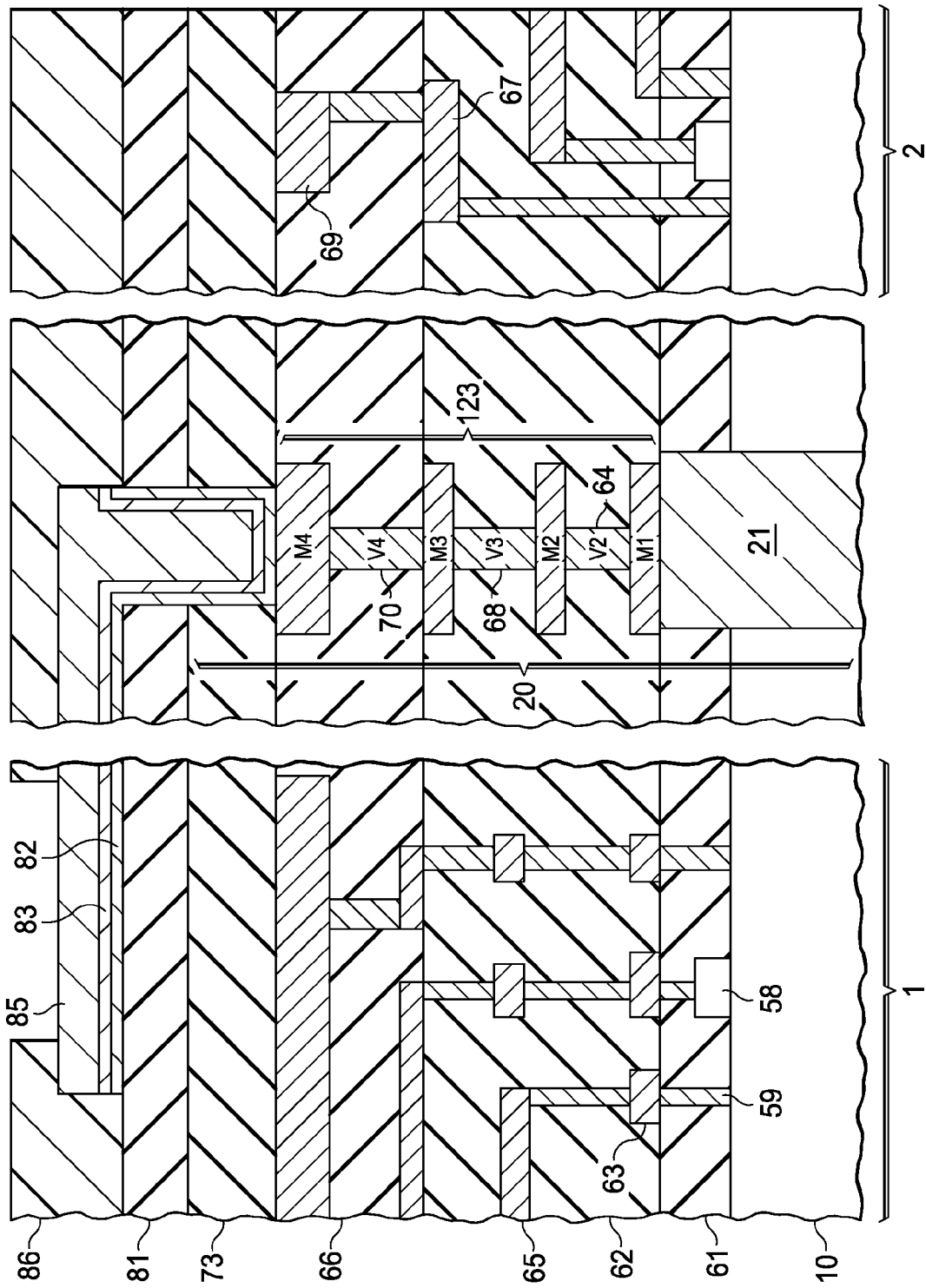
FIG. 5, which includes FIGS. 5a and 5b, describes a system on a chip comprising a top RF shield in various stages of fabrication, in accordance with an embodiment of the invention.

As illustrated in FIG. 5a, a second dielectric layer 86 is deposited over the redistribution metal line 85 (the second dielectric layer 86 covers the front side redistribution metal lines 85 and bump pads). The second dielectric layer 86 is coated, for example, by a spin-on process or applied using a chemical vapor deposition process. In various embodiments, the second dielectric layer 86 comprises organic polymer, BCB, polyimide, photoimide or inorganic dielectric. The second dielectric layer 86 is patterned using photo-lithography opening a part of the redistribution metal line 85 for forming bump pads as illustrated in FIG. 5b.

Figure 5B:
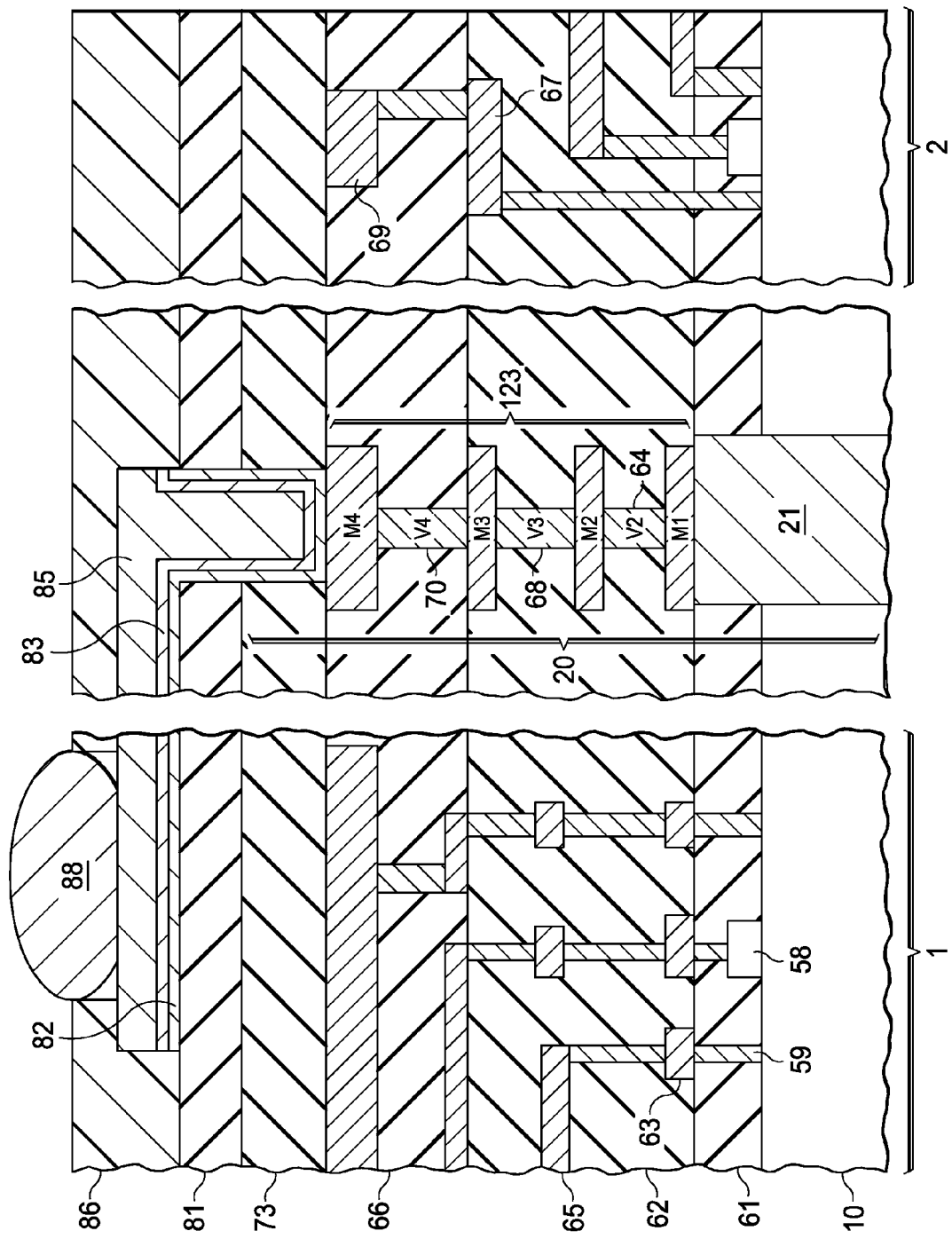

After the formation of the opening over the bump pads the solder balls 88 are placed in the opening (FIG. 5b). In other embodiments a solder flux (not shown) and a solder fill material is deposited in the exposed part of the redistribution metal line 85. The solder fill material is preferably electroplated, although, in other embodiments, other processes such as electroless plating or deposition processes such as vapor deposition may also be used. The solder fill material may be a single layer or comprise multiple layers with different compositions. For example, in one embodiment, the solder fill material comprises a lead (Pb) layer followed by a tin (Sn) layer. In another embodiment, a SnAg may be deposited as the solder fill material. Other examples include SnPbAg, SnPb, PbAg, PbIn, and lead free materials such as SnBi, SnAgCu, SnTn, and SiZn. In various embodiments, other suitable materials may be deposited.

A thermal treatment is performed to form the solder balls 88 illustrated in FIG. 5d. The solder balls 88 are isolated by the second dielectric layer 86 (FIG. 5b). The thermal treatment reflows the solder fill material and the heating forms the solder ball 88. For example, in the embodiment when Pb/Sb layer is deposited, after reflow, high lead alloys including 95 Pb/5 Sn (95/5) or 90 Pb/10 Sn (95/10) with melting temperatures in excess of 300° C. are formed. In a different embodiment, eutectic 63 Pb/37 Sn (63/37) with a melting temperature of 183° C. is formed. Similarly, a lead free solder ball 88 may be formed that comprises a composition of 97.5 Sn/2.6 Ag (97.5/2.5). The solder ball 88 comprises a homogeneous material and has a well defined melting temperature. For example, the high melting Pb/Sn alloys are reliable metallurgies which are particularly resistant to material fatigue. The metal from the redistribution metal line 85 may also diffuse and intermix during the thermal treatment. However, the metallic liner 81 is stable during heating and protects the inter diffusion of metal atoms into and from the last metal line (for example, from fourth metal line 69).

A thermal treatment is performed to form the solder balls 88 illustrated in FIG. 5b. The solder balls 88 are isolated by the second dielectric layer 86 (FIG. 5b). The thermal treatment reflows the solder fill material and the heating forms the solder ball 88. For example, in the embodiment when Pb/Sb layer is deposited, after reflow, high lead alloys including 95 Pb/5 Sn (95/5) or 90 Pb/10 Sn (95/10) with melting temperatures in excess of 300° C. are formed. In a different embodiment, eutectic 63 Pb/37 Sn (63/37) with a melting temperature of 183° C. is formed. Similarly, a lead free solder ball 88 may be formed that comprises a composition of 97.5 Sn/2.6 Ag (97.5/2.5). The solder ball 88 comprises a homogeneous material and has a well defined melting temperature. For example, the high melting Pb/Sn alloys are reliable metallurgies which are particularly resistant to material fatigue. The metal from the redistribution metal line 85 may also diffuse and intermix during the thermal treatment. However, the metallic liner 81 is stable during heating and protects the inter diffusion of metal atoms into and from the last metal line (for example, from fourth metal line 69).

Figure 6A:
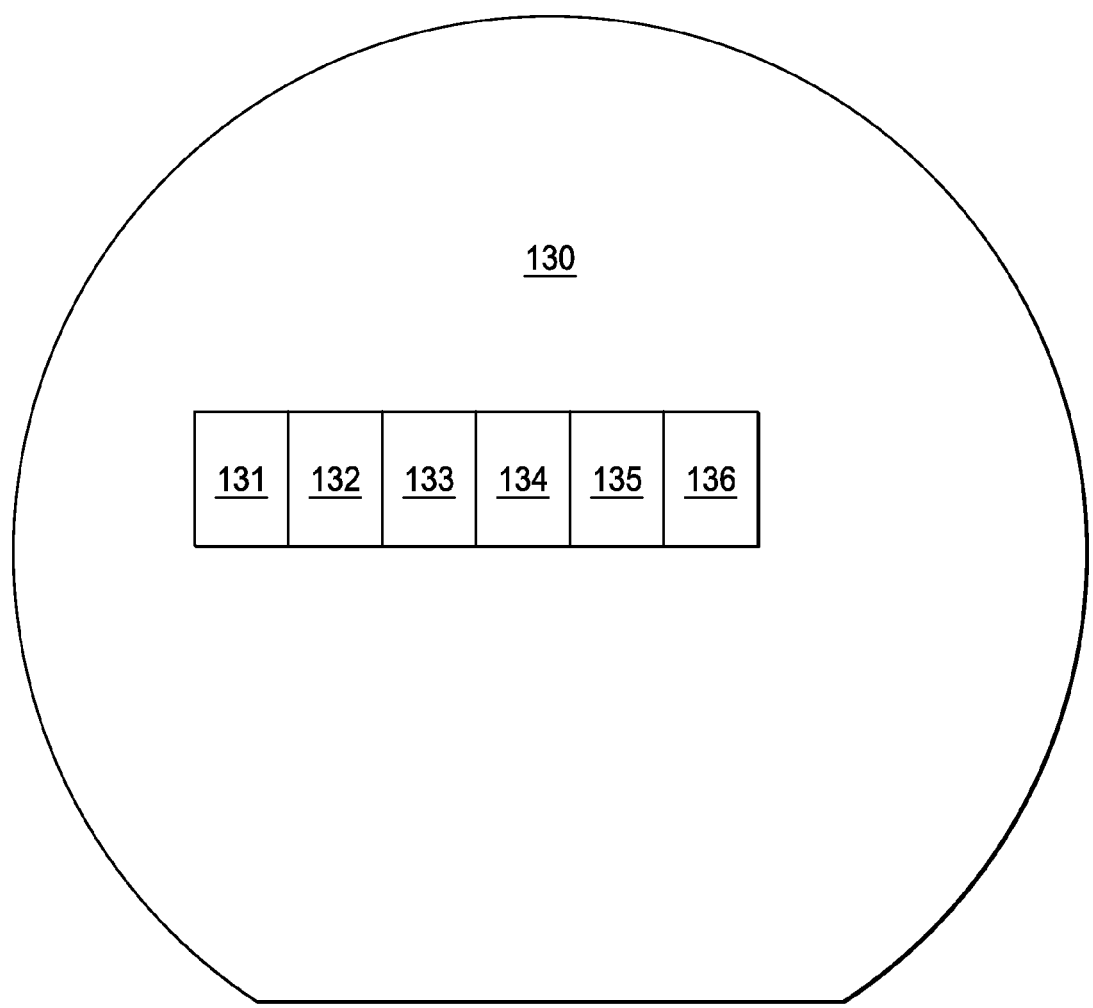
FIG. 6, which includes FIGS. 6a-6i, describes a system on a chip with a fan-out wafer level package and comprising a top shield in various stages of fabrication, in accordance with an embodiment of the invention.
Figure 6B:
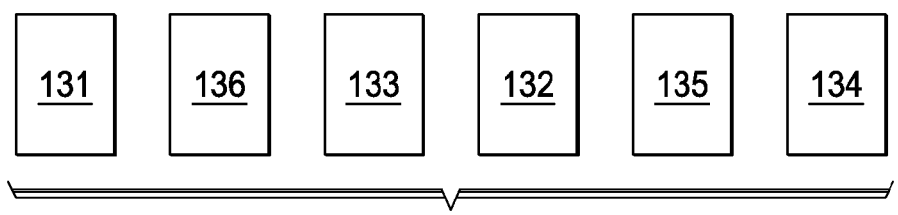
Figure 6C:
Figure 6D:
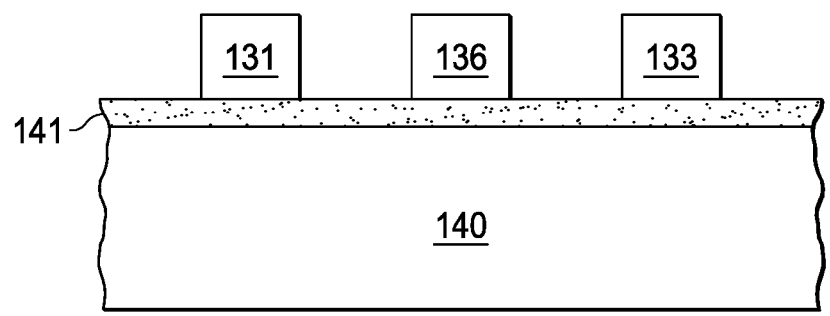

A top view of a wafer 130 after back end of the line processing is illustrated in FIG. 6a. The wafer 130 comprises a number of system on chips including chips 131-136. As illustrated in FIG. 6b, the wafer 130 is diced to form individual chips 131-136. FIG. 6c illustrates an adhesive tape 141 disposed on a carrier 140 used for arranging the chips 131-136. As illustrated in FIG. 6d, the front side of the chips 131-136 is placed on the adhesive tape 141 while maintaining a predetermined separation between the chips 131-136. This predetermined separation is larger than the separation between the chips 131-136 on the wafer 130. The glued chips 131-136 on the adhesive tape 141 are arranged in a circular manner emulating the shape of a wafer.

Figure 6E:
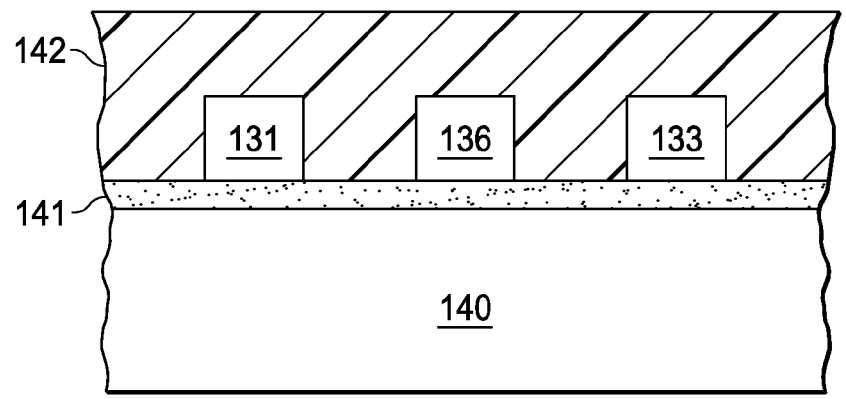
Figure 6F:
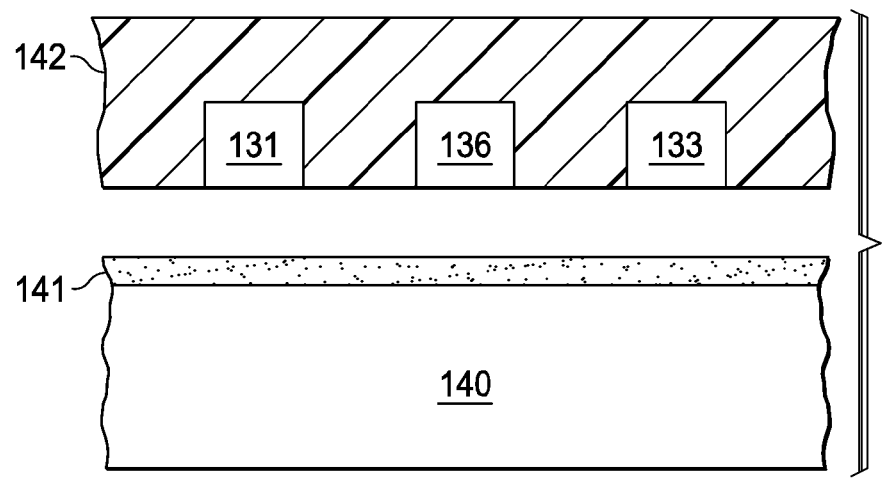
Figure 6G:
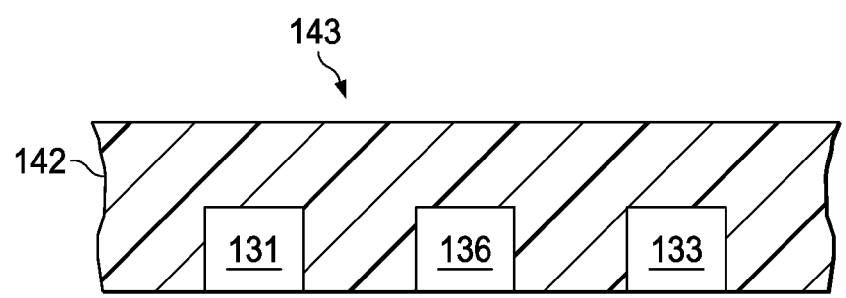
Figure 6H:
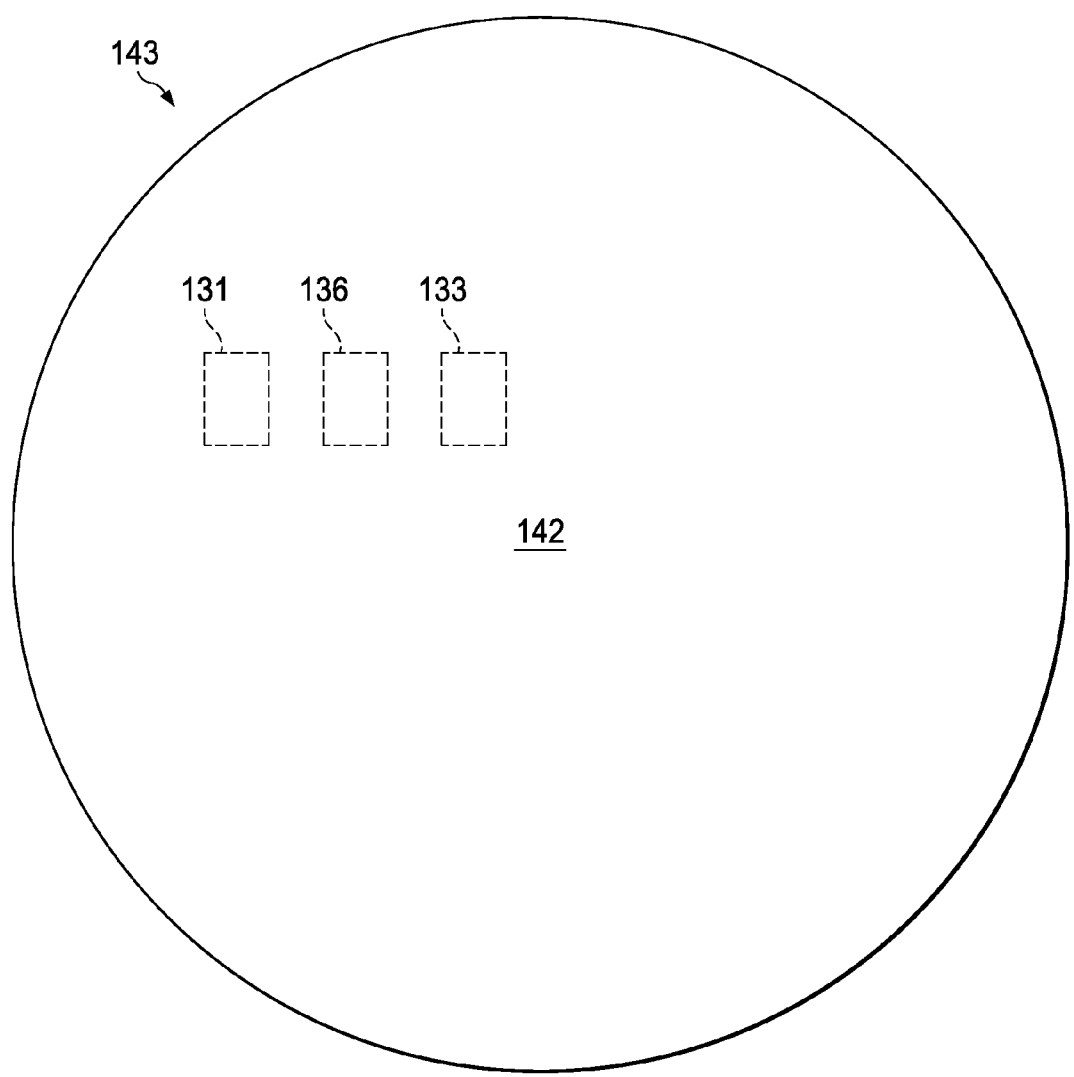
Figure 6I:
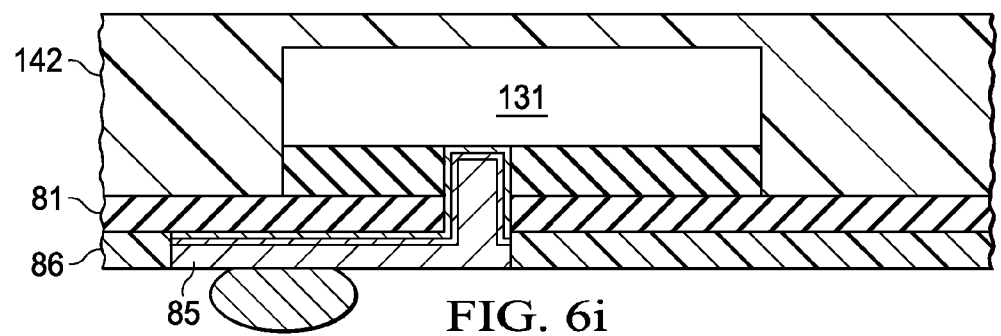

Referring to FIG. 6e, a mold compound 142 or epoxy compound is poured to fill in the gaps between the chips 131-136. The mold compound 142 is cured, for example, by annealing to form a reconfigured wafer 143 or a reconstituted wafer comprising the mold compound 142 and the individual chips 131-136. The reconfigured wafer 143 is separated from the adhesive tape 141 (as illustrated in FIGS. 6f and 6g). A top view of the reconfigured wafer 143 illustrating the individual chips 131-136 embedded in the mold compound 142 is illustrated in FIG. 6h. Subsequent processing follows the process steps detailed in FIGS. 3 and 4, and optionally FIGS. 5 and 6. A further dicing step, for example, sawing the reconfigured wafer 143 forms individual chips packaged with the mold compound 142. The chip after these steps is illustrated in FIG. 6i.

FIG. 8, which includes FIGS. 8a and 8b, illustrates an embodiment of the invention describing RF shield comprising through vias in a fan-out region around a chip.

As illustrated in FIG. 8a, a RF-shield 8 is formed comprising on-chip parts, redistribution lines 85 and fan-out through vias 89 with additional redistribution lines 185 for I/O connections to the RF circuit. The RF shield 8 comprises openings for interconnect connections 78 between the RF circuitry and other components. These connections are made either in the metallization levels or part of the redistribution layer comprising the redistribution lines 85.

As illustrated in FIG. 8a, an RF-shield 8 is formed comprising on-chip parts, redistribution lines 85 and fan-out through vias 89 with additional redistribution lines 185 for I/O connections to the RF circuit. The RF shield 8 comprises openings for interconnect connections 78 between the RF circuitry and other components. These connections are made either in the metallization levels or part of the redistribution layer comprising the redistribution lines 85.

Referring first to FIG. 8a, the SoC chip 99, as in prior embodiments, is embedded in a mold compound 142. One part of the system on chip 99 includes a RF component 1. The redistribution lines 85 and additional redistribution lines 185 are disposed above the RF component 1. The additional redistribution lines 185 couple to WLP bump pads 93. The redistribution lines 85 form a top shield 30 and comprise a mesh like structure above the RF component and couple to a ground potential node through ground bump pads 92.

In another embodiment, the through vias 89 are coupled to other components of the RF shield 8 through the back side redistribution lines (not shown). On the backside of the chip 99, the through vias 89 in the fan-out region are connected to the backside metallization of the SoC chip 99. The different parts of the RF-shield 8 form either a complete cage or part of a cage around the RF-circuitry, which protects neighbouring (non-RF-) parts of the chip or neighbouring chips on a board from the RF-radiation created in the RF-unit. All parts of the RF-shield are coupled to a node at ground potential. In various embodiments, an RF-chip in an embedded wafer level ball grid array (eWLB) or in a multi-chip package is completely surrounded by through vias 89 in the fan-out region 111. FIG. 8b, illustrates an embodiment comprising on-chip parts, redistribution lines 85 and through vias 89. The redistribution lines 85 are coupled to the on-chip parts through via pad 330. The redistribution lines 85 and back side redistribution lines 52 couple the through vias 89 to the through substrate via 21. The through vias 89 are not formed under the WLP ground bump pads 92 due to difficulty of forming subsequent solder ball 88, although in some embodiments, through vias 89 may be formed also under the WLP ground bump pads 92.

In another embodiment, the through vias 89 are coupled to other components of the RF shield 8 through the back side redistribution lines (not shown). On the backside of the chip 99, the through vias 89 in the fan-out region are connected to the backside metallization of the SoC chip 99. The different parts of the RF-shield 8 form either a complete cage or part of a cage around the RF-circuitry, which protects neighbouring (non-RF-) parts of the chip or neighbouring chips on a board from the RF-radiation created in the RF-unit. All parts of the RF-shield are coupled to a node at ground potential. In various embodiments, an RF-chip in an embedded wafer level ball grid array (eWLB) or in a multi-chip package is completely surrounded by through vias 89 in the fan-out region 111. FIG. 8b, illustrates an embodiment comprising on-chip parts, redistribution lines 85 and through vias 89. The redistribution lines 85 are coupled to the on-chip parts through via pad 330. The redistribution lines 85 and back side redistribution lines 52 couple the through vias 89 to the through substrate via 21. The through vias 89 are not formed under the WLP ground bump pads 92 due to difficulty of forming subsequent solder ball 88, although in some embodiments, through vias 89 may be formed also under the WLP ground bump pads 92.

Figure 9:
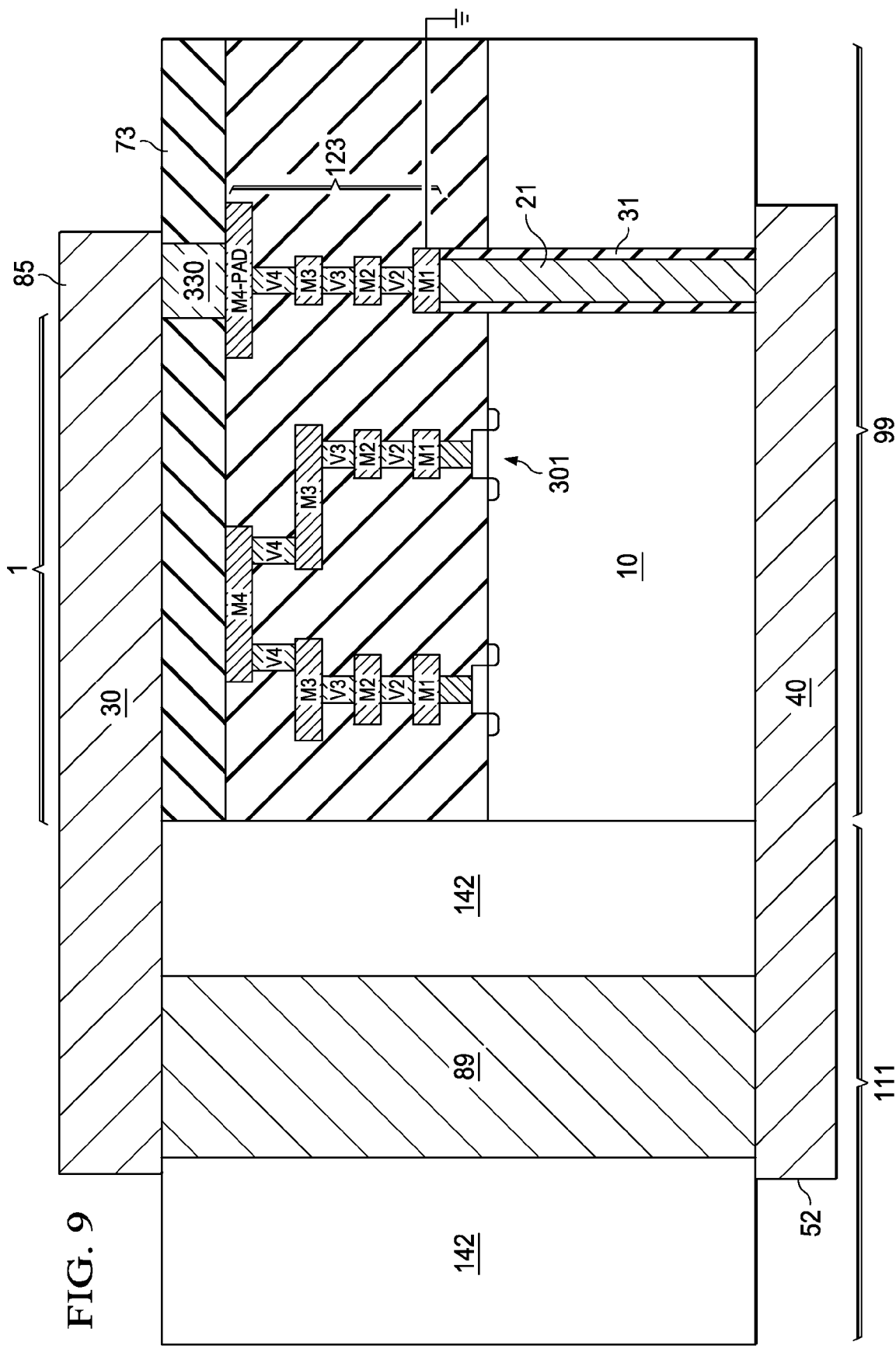
FIG. 9 illustrates a cross sectional view of a through via disposed in a fan-out region forming a RF shield, in accordance with an embodiment of the invention.

As illustrated in FIG. 9, the fan-out region 111 comprises a dielectric material, e.g., mold compound 142, epoxy resin or any other suitable spin-on dielectric. As the through vias 89 are embedded in the dielectric material (e.g., mold compound 142), the through vias 89 do not require an additional dielectric liner to electrically isolate the conducting core of the through vias 89. In various embodiments, the dimensions of the through vias 89 in the fan-out region 111 varies in diameter from about 30 μm to about 500 μm, and the depth depends on the remaining thickness of the chips or thickness of the reconstituted wafer which varies from about 20 μm up to about 800 μm.

Figure 10B:
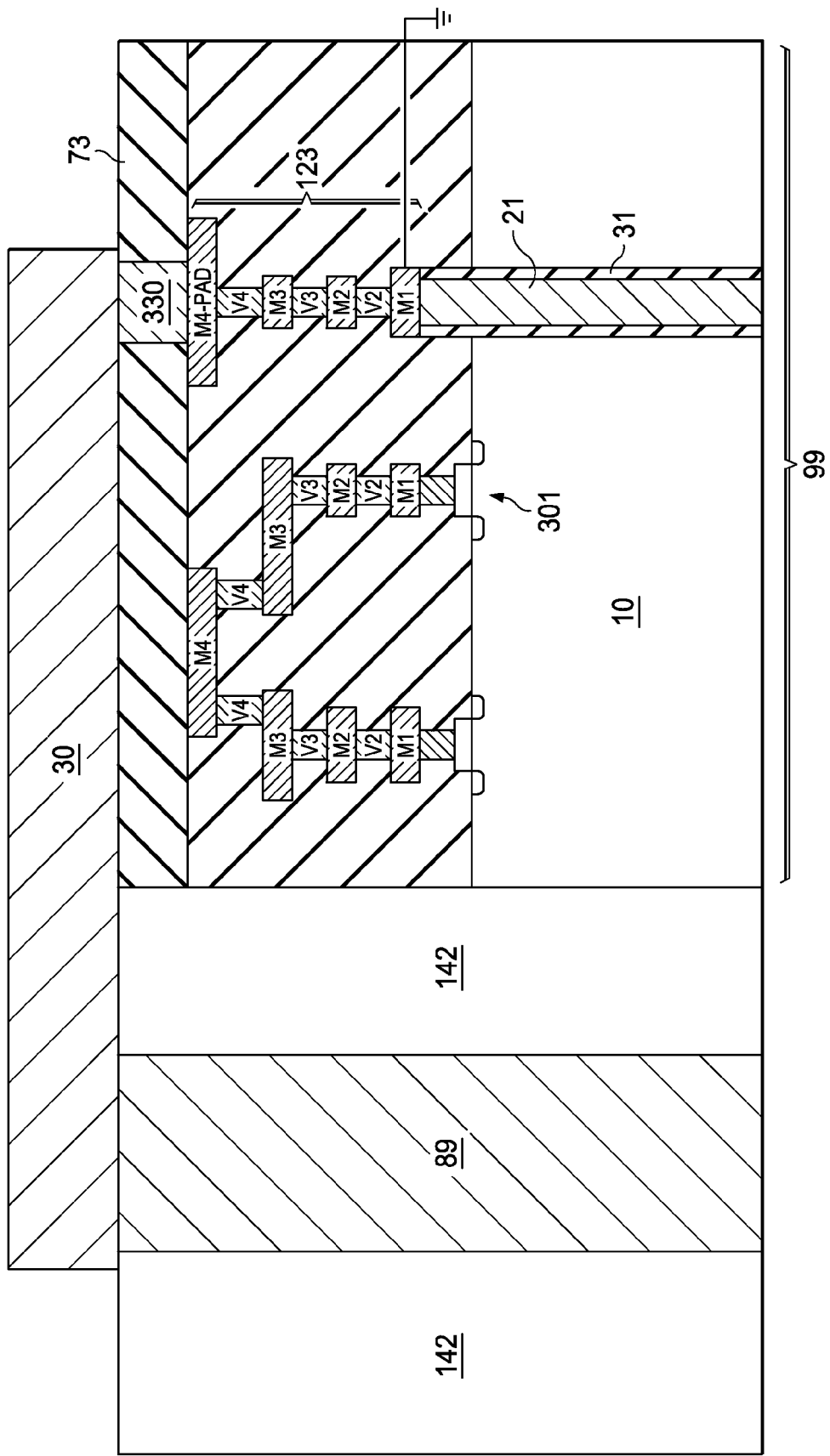
FIG. 10, which includes FIGS. 10a and 10b, describes a system on a chip with a fan-out wafer level package and comprising through vias in the fan-out region in various stages of fabrication, in accordance with an embodiment of the invention.

FIG. 10, which includes FIGS. 10*a* and 10*b*, illustrate cross sectional views of the fan-out region 111 and the SoC chip 99 during various stages of formation, in accordance with embodiments of the invention.

In various embodiments, the through vias 89 may be patterned either by a photo-lithography and etch combination or alternatively by a laser drilling process. As the fan-out through vias 89 are formed embedded in a dielectric material, additional formation of dielectric spacer around the fan-out through vias 89 is advantageously avoided.

Figure 11:
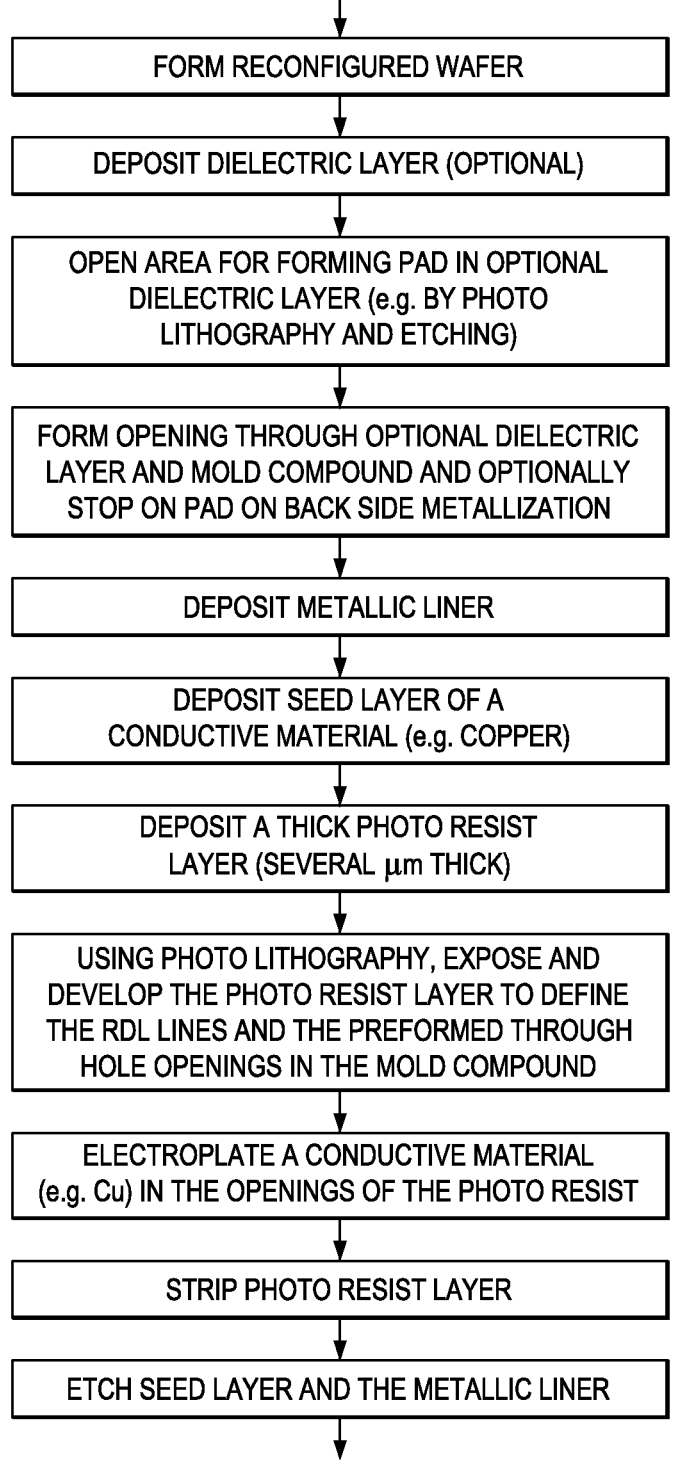
FIG. 11 illustrates a flow chart describing steps in a fabrication of the system on chip illustrated in FIG. 10, in accordance with an embodiment of the invention.
Figure 12:
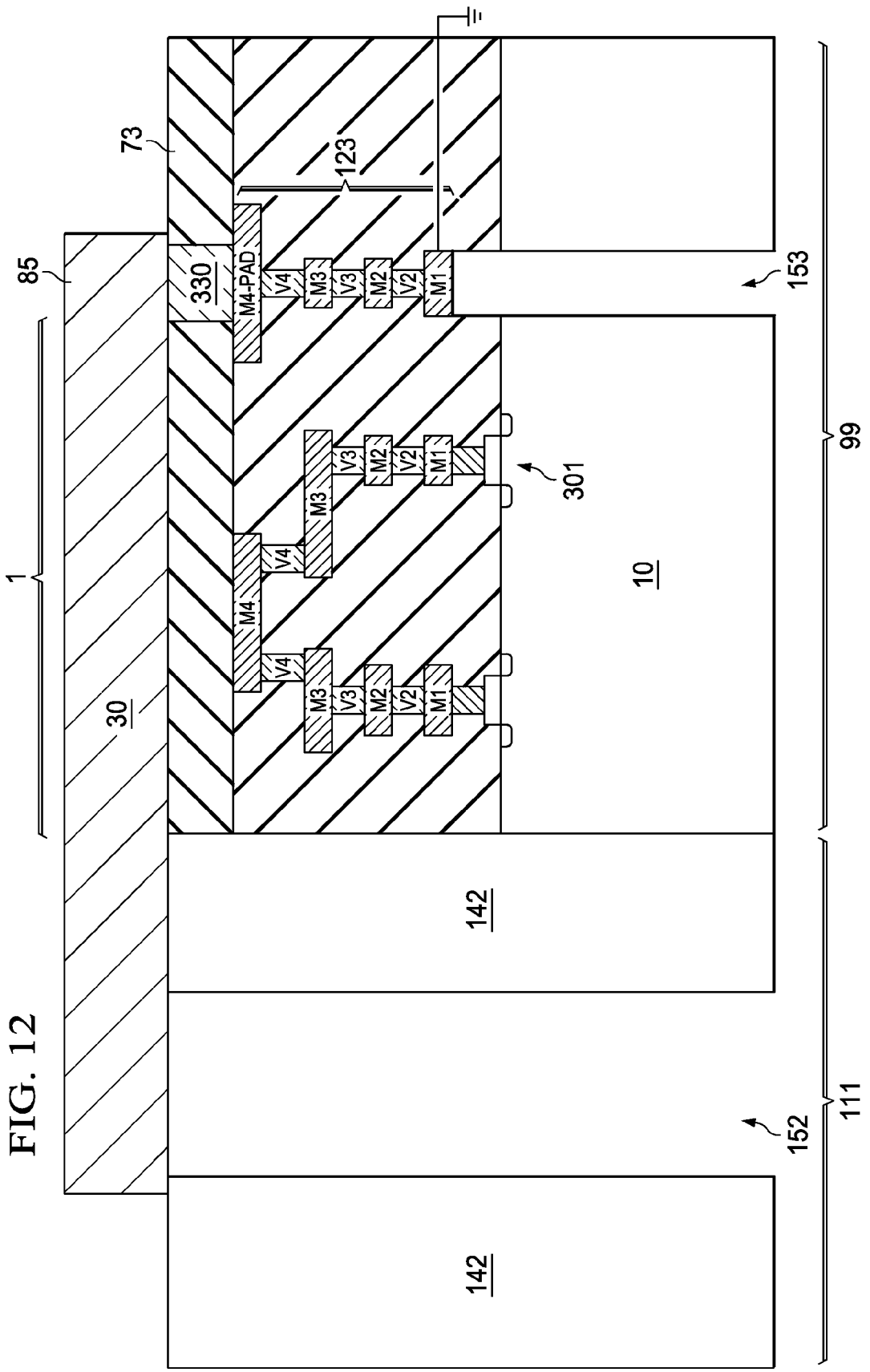
FIG. 12 describes a system on a chip with a fan-out wafer level package and comprising through vias in the fan-out region in various stages of fabrication, in accordance with an embodiment of the invention.

Referring to FIG. 10*a* and the flow chart of FIG. 11, a reconfigured wafer is formed as in prior embodiments. The reconfigured wafer is formed after forming the front side metallization layers and comprises the active devices 301 formed on a substrate 10. An optional dielectric layer is deposited over the top side of the reconfigured wafer (top side being the side on which active circuitry of the SoC chip 99 are formed). In various embodiments, the dielectric layer comprises organic polymer, BCB, polyimide, photoimide or inorganic dielectric layer and is deposited by spin-on, spray or CVD deposition. A opening is formed for forming bonding pads in the optional dielectric layer. Suitable methods for forming the opening include photo lithography and etching.

Next, as illustrated in FIG. 10*a*, a fan-out through hole 152 is formed. In various embodiments, the fan-out through hole 152 is formed by laser drilling through optional dielectric layer and through mold compound 152. If a bottom pad is present, in some embodiments, the etch forming the fan-out through hole 152 is stopped on the bottom pad in the backside metallization). Alternately, in some embodiments, photo-lithography is used to form a mask and a fan-out through hole 152 is etched out.

In various embodiments, the filling of the fan-out through hole 152 in the fan-out region 111 is performed simultaneously along with the formation of the redistribution lines 85. The fan-out through hole 152 is filled partially to minimize stress build up, although in some embodiments, the fan-out through hole 152 may be filled completely. A conductive liner e.g. a liner comprising TiW, Ta, TaN, Ti, TiN, W, WN, Ru is deposited by a suitable deposition process such as chemical vapour deposition (CVD), atomic layer deposition (ALD) or physical vapour deposition (PVD). A conductive seed layer is deposited using for example a PVD, CVD or a ALD process. In one embodiment, the conductive seed layer comprises copper. A thick photo resist layer (several μm thick) is deposited by spin-on or spray deposition. Using photo lithography, the thick photo resist layer is patterned to expose and develop to define pattern for forming redistribution lines. A conductive material, for example, copper, is filled into the pattern for forming redistribution lines and the fan-out through hole 152. The thick photo resist layer is stripped off exposing the seed layer. The exposed portion of the seed layer is etched to expose the conductive liner. The conductive liner is subsequently removed. As illustrated in FIG. 11*b*, at this stage, the fan-out through vias 89, the WLB bump pads, the RDL lines of the RF-shield and other RDL lines for signal routing or for I/O routing to the bump pads are now defined.

In some embodiments, further processing may be performed depending on the application. For example, in one embodiment, optional deposition of a dielectric layer over the redistribution (RDL) lines, bump pads and fan-out through vias 89. The bump pads are in the optional dielectric (e.g., by photo lithography and etching). Solder bumps are deposited over the bump pads. Additional back side grinding, dicing and back side metallization for forming back side RF shield or for other application may be performed.

In various embodiments, the filling of the fan-out through hole 152 in the fan-out region 111 is performed simultaneously along with the formation of the redistribution lines 85. The fan-out through hole 152 is filled partially to minimize stress build up, although in some embodiments, the fan-out through hole 152 may be filled completely. A conductive liner e.g. a liner comprising TiW, Ta, TaN, Ti, TiN, W, WN, Ru is deposited by a suitable deposition process such as chemical vapour deposition (CVD), atomic layer deposition (ALD) or physical vapour deposition (PVD). A conductive seed layer is deposited using for example a PVD, CVD or a ALD process. In one embodiment, the conductive seed layer comprises copper. A thick photo resist layer (several μm thick) is deposited by spin-on or spray deposition. Using photo lithography, the thick photo resist layer is patterned to expose and develop to define pattern for forming redistribution lines. A conductive material, for example, copper, is filled into the pattern for forming redistribution lines and the fan-out through hole 152. The thick photo resist layer is stripped off exposing the seed layer. The exposed portion of the seed layer is etched to expose the conductive liner. The conductive liner is subsequently removed. As illustrated in FIG. 10*b*, at this stage, the fan-out through vias 89, the WLB bump pads, the RDL lines of the RF-shield and other RDL lines for signal routing or for I/O routing to the bump pads are now defined.

Figure 13:
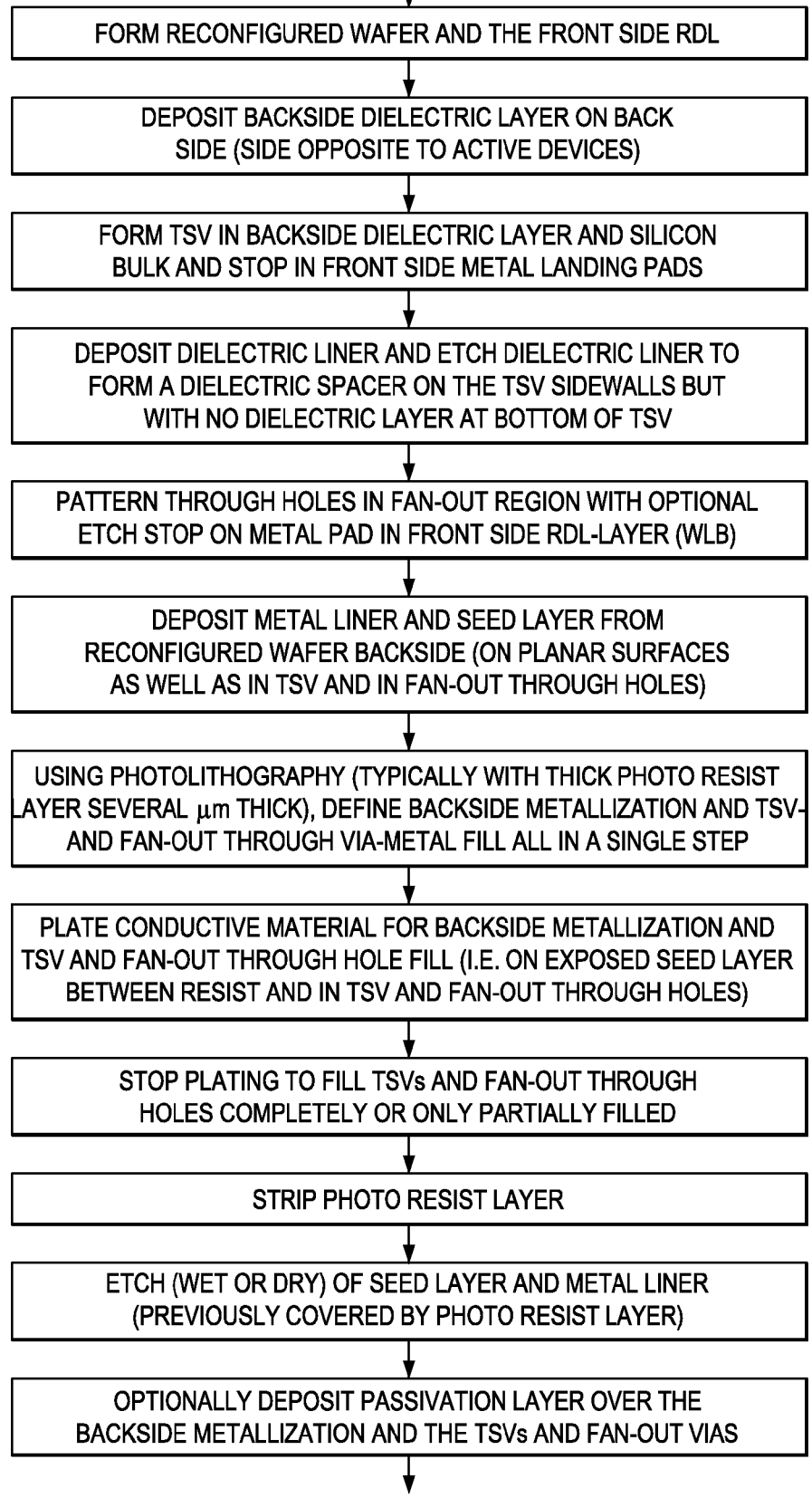
FIG. 13 illustrates a flow chart describing steps in a fabrication of the system on chip illustrated in FIG. 12, in accordance with an embodiment of the invention.

As described in the flow chart of FIG. 13, the frontside WLB (RDL) processing is completed before forming any fan-out through hole 152. In this embodiment, the reconfigured wafer is formed after the front side wafer processing. After the formation of the reconfigured wafer and the deposition of an optional dielectric (e.g. spin-on polymer) the redistribution lines 85 and WLB pads are deposited. In one embodiment the redistribution lines and WLB pads are deposited by a pattern plating process and connect to on-chip interconnect pads by vias 330. However, unlike the prior embodiment, in one embodiment, the through hole 152 and the through substrate via 21 are not formed at this stage. A backside dielectric layer comprising for example, oxide, nitride, polyimide, photoimide, etc. is deposited over the back side of the reconfigured wafer by CVD or spin-on coating. If the through substrate via 21 is not formed, the back side dielectric layer is patterned using photo lithography steps to form pattern for forming through substrate via on the chip 99, and through via in the fan-out region 111, and back side redistribution layer including back side redistribution lines forming the bottom shield of the RF shield. The through via and through substrate via etch forms a fan-out through hole 152 and a through substrate hole 153. The etch is designed to stop on the front side metal landing pads.

A dielectric spacer is formed around the through substrate hole 153. This dielectric spacer while necessary for the through substrate hole 153 is not deleterious to the fan-out through substrate hole 152. Hence, in some embodiments, the dielectric spacer may be formed inside both the fan-out through hole 152 and a through substrate hole 153.

In some embodiments, a fan-out through hole 152 and a through substrate hole 153 are formed using separate etching steps. The through hole 152 is formed either by a photo lithography and etch process or using a laser drilling process. If an etch process is used, the front side redistribution layer may be used as an etch stop in one embodiment. The use of separate etching steps enables tailoring the etch or drilling process to the needs of each structure. Metal liner and a conductive seed layer is deposited on the backside of the reconfigured. The metal liner and conductive seed layer are deposited on planar surfaces as well as in the fan-out through hole 152 and the through substrate hole 153. A thick photo resist layer (for example, several µm thick) is deposited to define back side metallization and through silicon via and fan-out through via metal fill all in a single deposition step. A thick metal layer is electro-plated from the back side, filling the fan-out through hole 152 and the through substrate hole 153. In various embodiments, the fan-out through hole 152 and the through substrate hole 153 are filled partially, although in some embodiments a complete fill may be performed. The metal layer comprises copper, although in other embodiments, other suitable metals may be used. The thick photo resist layer is removed. The conductive seed layer and the metal liner (previously covered by resist) are removed using wet or dry etch chemistries.

The cross section at this stage of fabrication is illustrated in FIG. 9, and illustrates the through substrate vias 21, fan-out through vias 89, and the back side redistribution lines 52. A passivation layer may be optionally deposited over the backside metallization and the through substrate vias 21 and fan-out through vias 89.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a system on a chip, the method comprising:
   forming a radio frequency (RF) device in a first region of a substrate and forming a semiconductor device in a second region of the substrate, the first region and second region separated by a third region comprising no active devices;
   forming a stack of metal lines and vias disposed on the third region;
   forming a pad disposed on a last metal line of the stack of metal lines and vias; and
   forming redistribution lines over the last metal line and coupled to the pad, wherein the redistribution lines are coupled to a ground potential node and form a first structure above the first region, the first structure comprises a structure selected from the group consisting of a mesh, a finger, a plate, or a combination thereof.

2. The method of claim 1, further comprising forming wafer level packaging bump pads, the wafer level packaging bump pads being coupled to the redistribution lines.

3. The method of claim 2, wherein the wafer level package packaging bump pad is formed on a molding compound, wherein the system on chip is surrounded by the molding compound.

4. The method of claim 3, further comprising forming through vias in the molding compound, the through vias being formed coupled to the redistribution lines.

5. The method of claim 1, wherein forming the redistribution lines comprises forming second redistribution lines laterally spaced from the RF device in the first region, the second redistribution lines electrically isolated from the first structure.

6. The method of claim 1, wherein the redistribution lines substantially block electromagnetic radiation emanating from the RF device.

7. A method of fabricating a semiconductor chip, the method comprising:
   dicing a wafer to form individual chips;
   arranging the individual chips on an adhesive tape, the individual chips being separated by a gap of a predetermined distance;
   filling the gap between the individual chips with a mold compound;
   curing the mold compound and separating from the adhesive tape to form a reconfigured wafer; and
   forming first redistribution lines on the reconfigured wafer, wherein the first redistribution lines are coupled together and to a ground potential node, wherein the first redistribution lines are arranged to form a first set of parallel metal lines, the first set of parallel metal lines being coupled together by a second set of parallel metal lines.

8. The method of claim 7, wherein the first and the second set of metal lines form a mesh or a finger structure.

9. The method of claim 7, wherein the first set of parallel metal lines and the second set of parallel metal lines are perpendicular to each other.

10. The method of claim 7, wherein the first redistribution lines are designed to block electromagnetic radiation emanating from a RF component disposed on each chip of the individual chips.

11. The method of claim 7, further comprising forming second redistribution lines on the reconfigured wafer, the second redistribution lines coupled to input/output connection nodes.

12. The method of claim 7, wherein each chip comprises a semiconductor substrate, interconnect levels disposed above the semiconductor substrate, a top surface disposed above all of the interconnect levels of the chip, and a semiconductor component integrated in an upper surface of the semiconductor substrate of the chip.

13. The method of claim 7, further comprising:
forming wafer level packaging bump pads, the wafer level packaging bump pads being coupled to the first redistribution lines, wherein the wafer level packaging bump pads are disposed on the cured mold compound; and
forming through vias in the cured molding compound, the through vias being formed to coupled to the redistribution lines or wafer level packaging bump pads.

14. The method of claim 13, further comprising forming through substrate vias in each chip of the individual chips, the through substrate vias coupled to the through vias, wherein the through substrate vias coupled to the through vias through the first redistribution lines.

15. The method of claim 14, wherein the through substrate vias and the through vias are filled using a single deposition process.

16. A method of fabricating a semiconductor chip, the method comprising:
providing a plurality of semiconductor chips, each chip including a substrate comprising a radio frequency (RF) device in a first region of the substrate and a semiconductor device in a second region of the substrate, the first region and second region separated by a third region comprising no active devices, wherein through substrate vias are disposed in the third region;
forming a reconfigured wafer from the plurality of semiconductor chips by arranging the plurality of semiconductor chips next to each other and filling a gap between adjacent chips of the plurality of semiconductor chips with a molding compound, the reconfigured wafer comprising the molding compound surrounding each chip of the plurality of semiconductor chips;
forming through vias in the molding compound; and
coupling the through substrate vias and the through vias to a node coupled to a ground potential.

17. The method of claim 16, further comprising forming first redistribution lines disposed over each chip of the plurality of semiconductor chips, the first redistribution lines being coupled to the through vias.

18. The method of claim 16, wherein forming the reconfigured wafer comprises:
dicing a wafer to form individual chips;
arranging the individual chips on an adhesive tape, the individual chips being separated by a predetermined distance;
filling a gap between the individual chips with a mold compound; and
curing the mold compound and separating from the adhesive tape to form the reconfigured wafer.

19. The method of claim 16, wherein the through substrate vias are coupled to the through vias through redistribution lines.

20. The method of claim 16, wherein the through vias are disposed along the RF device but not along the semiconductor device.

* * * * *

UNITED STATES PATENT AND TRADEMARK OFFICE
CERTIFICATE OF CORRECTION

PATENT NO.       : 8,617,929 B2  
APPLICATION NO.  : 13/456331  
DATED            : December 31, 2013  
INVENTOR(S)      : Hans-Joachim Barth Page 1 of 1

It is certified that error appears in the above-identified patent and that said Letters Patent is hereby corrected as shown below:

In the Claims

In Col. 14, line 17, claim 3, after "wafer level" delete "package".

Signed and Sealed this
Fifteenth Day of April, 2014

Michelle K. Lee
*Deputy Director of the United States Patent and Trademark Office*